(12) United States Patent
Hemink et al.

(10) Patent No.: US 7,463,531 B2
(45) Date of Patent: Dec. 9, 2008

(54) SYSTEMS FOR PROGRAMMING NON-VOLATILE MEMORY WITH REDUCED PROGRAM DISTURB BY USING DIFFERENT PRE-CHARGE ENABLE VOLTAGES

(75) Inventors: Gerrit Jan Hemink, Yokohama (JP); Yingda Dong, Sunnyvale, CA (US); Jeffrey W. Lutze, San Jose, CA (US); Dana Lee, Saratoga, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/618,606

(22) Filed: Dec. 29, 2006

(65) Prior Publication Data

US 2008/0158991 A1 Jul. 3, 2008

(51) Int. Cl.
*G11C 16/06* (2006.01)

(52) U.S. Cl. .................. 365/185.25; 365/185.17; 365/185.18; 365/203

(58) Field of Classification Search ............ 365/185.21, 365/185.17, 185.18, 203, 185.02, 185.03, 365/185.22, 185.28
See application file for complete search history.

(56) References Cited

U.S. PATENT DOCUMENTS

| 5,043,940 A | 8/1991 | Harari |
| 5,172,338 A | 12/1992 | Mehrotra |
| 5,570,315 A | 10/1996 | Tanaka |
| 5,621,684 A | 4/1997 | Jung |
| 5,621,689 A | 4/1997 | Sakakibara et al. |
| 5,677,873 A | 10/1997 | Choi |
| 5,715,194 A | 2/1998 | Hu |
| 5,774,397 A | 6/1998 | Endoh |
| 5,818,757 A | 10/1998 | So |
| 5,887,145 A | 3/1999 | Harari |
| 5,973,962 A | 10/1999 | Kwon |
| 5,991,202 A | 11/1999 | Derhacobian |
| 6,011,287 A | 1/2000 | Itoh |
| 6,046,935 A | 4/2000 | Takeuchi |
| 6,049,494 A | 4/2000 | Sakui |
| 6,061,270 A | 5/2000 | Choi |
| 6,107,658 A | 8/2000 | Itoh |
| 6,181,599 B1 | 1/2001 | Gongwer |
| 6,456,528 B1 | 9/2002 | Chen |
| 6,493,265 B2 | 12/2002 | Satoh |
| 6,522,580 B2 | 2/2003 | Chen |

(Continued)

OTHER PUBLICATIONS

Notice of Allowance and Fee(s) Due, United States Patent & Trademark Office, U.S. Appl. No. 11/618,580, filed Dec. 29, 2006, Mar. 25, 2008.

(Continued)

*Primary Examiner*—David Lam
(74) *Attorney, Agent, or Firm*—Vierra Magen Marcus & DeNiro LLP

(57) ABSTRACT

Unselected groups of non-volatile storage elements are boosted during programming to reduce or eliminate program disturb for targeted, but unselected memory cells connected to a selected word line. Prior to applying a program voltage to the selected word line and boosting the unselected groups, the unselected groups are pre-charged to further reduce or eliminate program disturb by providing a larger boosted potential for the unselected groups. During pre-charging, one or more pre-charge enable signals are provided at different voltages for particular non-volatile storage elements.

25 Claims, 15 Drawing Sheets

U.S. PATENT DOCUMENTS

| | | | |
|---|---|---|---|
| 6,525,964 | B2 | 2/2003 | Tanaka |
| 6,614,688 | B2 | 9/2003 | Jeong |
| 6,643,188 | B2 | 11/2003 | Tanaka |
| 6,859,394 | B2 | 2/2005 | Matsunaga |
| 6,859,395 | B2 | 2/2005 | Matsunaga |
| 6,859,397 | B2 | 2/2005 | Lutze |
| 7,006,380 | B2 * | 2/2006 | Toda ............... 365/185.21 |
| 7,009,881 | B2 | 3/2006 | Noguchi |
| 7,145,806 | B2 | 12/2006 | Kawai |
| 7,161,833 | B2 | 1/2007 | Hemink |
| 7,170,793 | B2 | 1/2007 | Guterman |
| 2004/0080980 | A1 | 4/2004 | Lee |
| 2005/0237829 | A1 | 10/2005 | Nakamura et al. |
| 2007/0171718 | A1 | 7/2007 | Hemink et al. |
| 2007/0171719 | A1 | 7/2007 | Hemink et al. |

OTHER PUBLICATIONS

Non-Final Office Action, United States Patent & Trademark Office, U.S. Appl. No. 11/618,600, filed Dec. 29, 2006, Apr. 4, 2008.

Non-Final Office Action, United States Patent & Trademark Office, U.S. Appl. No. 11/618,594, filed Dec. 29, 2006, Apr. 30, 2008.

Response to Non-Final Office Action, U.S. Appl. No. 11/618,594, filed Dec. 29, 2006, May 16, 2008.

Response to Non-Final Office Action, U.S. Appl. No. 11/618,600, filed Dec. 29, 2006, May 16, 2008.

S.Aritome, et al., "Reliability Issues of Flash Memory Cells," Proceedings of the IEEE, New York, vol. 81, No. 5, May 1993, pp. 776-788.

Jung, et al., "A 3.3V 128Mb Multi-Level NAND Flash Memory for Mass Storage Applications," ISSCC96, Session 2, Flash Memory, Paper TP 2.1, IEEE, pp. 32-33, slide supplement pp. 20-21, 346-347 (1996).

Jung, et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.

A Modelli, et al., "Basic Feasibility Constraints for Multilevel CHE-Programmed Flash Memories," IEEE Trans. on Electron Devices, vol. 48, No. 9, Sep. 2001, pp. 2032-2042.

T. Nozaki, et al., "A 1-Mb EEPROM with MONOS Memory Cell for Semiconducor Disk Application," IEEE Journal of Solid-State Circuits, vol. 26, No. 4, Apr. 1991, pp. 497-501.

K.D. Suh, et al., "A 3.3V 32Mb NAND Flash Memory with Incremental Step Pulse Programming Scheme," IEEE Journal of Solid-State Circuits, vol. 30, No. 11, Nov. 1995, pp. 1149-1155.

U.S. Appl. No. 11/535,628, filed Sep. 27, 2006 entitled, "Reducing Program Disturb In Non-Volatile Storage,".

U.S. Appl. No. 11/618,580, filed Dec. 29, 2006 entitled, "Programming Non-Volatile Memory With Reduced Program Disturb By Removing Pre-Charge Dependency On Word Line Data,".

U.S. Appl. No. 11/618,594, filed Dec. 29, 2006 entitled, "Systems For Programming Non-Volatile Memory With Reduced Program Disturb By Removing Pre-Charge Dependency On Word Line Data,".

U.S. Appl. No. 11/618,600, filed Dec. 29, 2006 entitled, "Programming Non-Volatile Memory With Reduced Program Disturb By Using Different Pre-Charge Enable Voltages,".

International Search Report and The Written Opinion of the International Searching Authority, Patent Cooperation Treaty, Application No. PCT/US2007/088947 filed Dec. 27, 2007, Aug. 13, 2008.

International Search Report and The Written Opinion of the International Searching Authority, Patent Cooperation Treaty, Application No. PCT/US2007/088931 filed Dec. 27, 2007, May. 27, 2008.

Notice of Allowance and Fee(s) Due, United States Patent & Trademark Office, U.S. Appl. No. 11/618,594 filed on Dec. 29, 2006, Jun. 23, 2008.

Notice of Allowance and Fee(s) Due, United States Patent & Trademark Office, U.S. Appl. No. 11/618,600 filed on Dec. 29, 2006, Jul. 1, 2008.

* cited by examiner

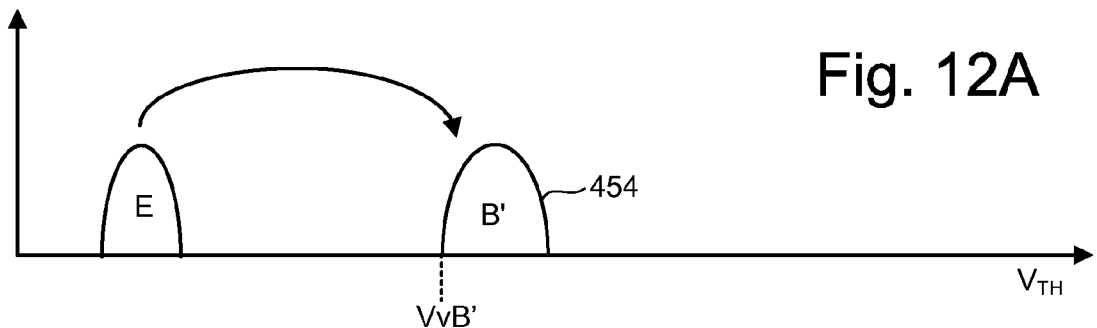
Fig. 12A
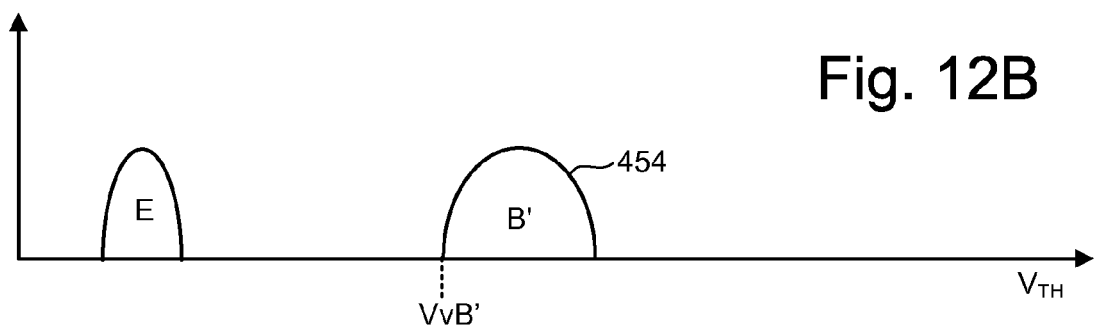
Fig. 12B
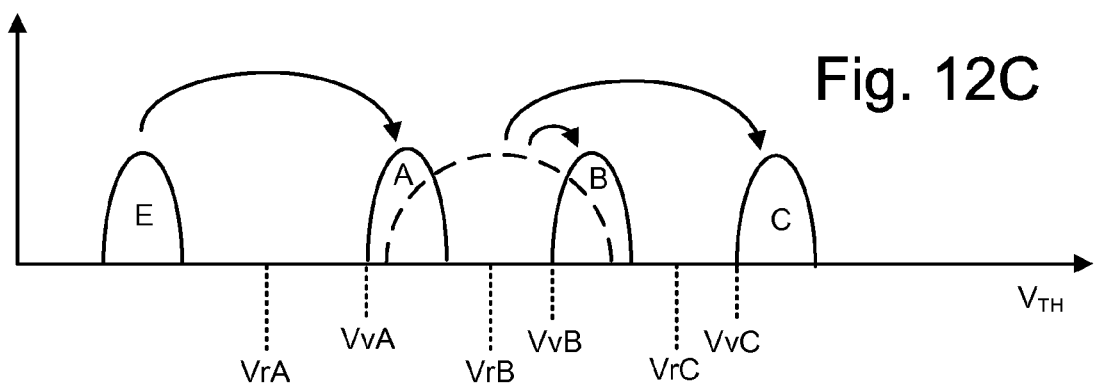
Fig. 12C
Fig. 13

SYSTEMS FOR PROGRAMMING NON-VOLATILE MEMORY WITH REDUCED PROGRAM DISTURB BY USING DIFFERENT PRE-CHARGE ENABLE VOLTAGES

CROSS-REFERENCE TO RELATED APPLICATIONS

The following applications are cross-referenced and incorporated by reference herein in their entirety:

U.S. patent application Ser. No. 11/618,580, entitled "Programming Non-Volatile Memory with Reduced Program Disturb by Removing Pre-Charge Dependency on Word Line Data," by Dong, et al., filed on even date herewith;

U.S. patent application Ser. No. 11/618,594, entitled "Systems for Programming Non-Volatile Memory with Reduced Program Disturb by Removing Pre-Charge Dependency on Word Line Data," by Dong, et al., filed on even date herewith;

U.S. patent application Ser. No. 11/618,600, entitled "Programming Non-Volatile Memory with Reduced Program Disturb by Using Different Pre-Charge Enable Voltages," by Hemink, et al., filed on even date herewith.

BACKGROUND OF THE INVENTION

1. Field of the Invention

Embodiments of the present disclosure are directed to non-volatile memory technology.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM), including flash EEPROM, and Electronically Programmable Read Only Memory (EPROM) are among the most popular non-volatile semiconductor memories.

One example of a flash memory system uses the NAND structure, which includes arranging multiple transistors in series between two select gates. The transistors in series and the select gates are referred to as a NAND string. FIG. 1 is a top view showing one NAND string 30. FIG. 2 is an equivalent circuit thereof. The NAND string depicted in FIGS. 1 and 2 includes four transistors 10, 12, 14 and 16 in series between a first select gate 12 and a second select gate 22. The drain select gate 12 connects the NAND string to bit line 26. The source gate 22 connects the NAND string to source line 28. Select gate 12 is controlled by applying appropriate voltages to control gate 20CG via selection line SGD. Select gate 22 is controlled by applying the appropriate voltages to control gate 22CG via selection line SGS. Each of the transistors 10, 12, 14 and 16 includes a control gate and a floating gate, forming the gate elements of a memory cell. For example, transistor 10 includes control gate 10CG and floating gate 10FG. Transistor 12 includes control gate 12CG and a floating gate 12FG. Transistor 14 includes control gate 14CG and floating gate 14FG. Transistor 16 includes a control gate 16CG and a floating gate 16FG. Control gate 10CG is connected to word line WL3, control gate 12CG is connected to word line WL2, control gate 14CG is connected to word line WL1, and control gate 16CG is connected to word line WL0. Another type of memory cell useful in flash EEPROM systems utilizes a non-conductive dielectric material in place of a conductive floating gate to store charge in a non-volatile manner.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string. Relevant examples of NAND-type flash memories and their operation are provided in the following U.S. patents/patent applications, all of which are incorporated herein by reference in their entirety: U.S. Pat. No. 5,570,315; U.S. Pat. No. 5,774,397; U.S. Pat. No. 6,046,935; U.S. Pat. No. 5,386,422; U.S. Pat. No. 6,456,528; and U.S. patent application Ser. No. 09/893,277 (Publication No. U.S. 2003/0002348). Other types of non-volatile memory in addition to NAND flash memory can also be used in accordance with embodiments.

A typical architecture for a flash memory system using a NAND structure will include several NAND strings. For example, FIG. 3 shows three NAND strings 40, 42 and 44 of a memory array having many more NAND strings. Each of the NAND strings of FIG. 3 includes two select transistors or gates and four memory cells. NAND string 40 includes select transistors 50 and 60, and memory cells 52, 54, 56 and 58. NAND string 42 includes select transistors 70 and 80, and memory cells 72, 74, 76 and 78. Each string is connected to the source line by a source select gate 60, 80, etc. A selection line SGS is used to control the source side select gates. The various NAND strings are connected to respective bit lines by drain select gates 50, 70, etc., which are controlled by select line SGD. In other embodiments, the select lines do not necessarily need to be in common. Word line WL3 is connected to the control gates for memory cell 52 and memory cell 72. Word line WL2 is connected to the control gates for memory cell 54 and memory cell 74. Word line WL1 is connected to the control gates for memory cell 56 and memory cell 76. Word line WL0 is connected to the control gates for memory cell 58 and memory cell 78. A bit line and respective NAND string comprise a column of the array of memory cells. The word lines comprise the rows of the array. Each word line connects the control gates of each memory cell in the row. For example, word line WL2 is connected to the control gates for memory cells 54, 74 and 94. In many implementations, the word lines form the control gate of each memory cell in the row.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. The floating gate charge and threshold voltage of the cell can be indicative of a particular state corresponding to stored data (analog or digital). More information about programming can be found in U.S. patent application Ser. No. 10/629,068, titled "Detecting Over Programmed Memory," filed on Jul. 29, 2003, incorporated herein by reference in its entirety.

To apply the program voltage to the control gate of the cell being programmed, that program voltage is applied on the appropriate word line. As discussed above, that word line is also connected to one cell in each of the other NAND strings that utilize the same word line. For example, when programming cell 54 of FIG. 3, the program voltage will also be applied to the control gate of cell 74 because both cells share the same word line WL2. A problem arises when it's desired to program one cell on a word line without programming other cells connected to the same word line. Because the program voltage is applied to all cells connected to a word line, an unselected cell connected to the selected word line receiving the program voltage, especially a cell adjacent to the cell selected for programming, may be inadvertently programmed. The unintentional programming of the unselected cell on the selected word line is referred to as "program disturb."

Several techniques can be employed to prevent program disturb. In one method known as "self boosting," the channel areas of the unselected NAND strings are electrically isolated and a pass voltage (e.g. 10V) is applied to the unselected word lines during programming. The unselected word lines couple to the channel areas of the unselected NAND strings, causing a voltage (e.g. 8V) to be impressed in the channel and source/drain regions of the unselected NAND strings, thereby reducing program disturb. Self boosting causes a voltage boost to exist in the channel which lowers the voltage across the tunnel oxide and hence reduces program disturb.

FIGS. 4 and 5 depict NAND strings that are being programmed and inhibited using a self-boosting method, respectively. FIG. 4 depicts a NAND string being programmed. The NAND string of FIG. 4 includes eight memory cells 102, 104, 106, 108, 110, 112, 114, 116 connected in series between drain select gate 120 and source select gate 122. Drain select gate 120 connects the string to a particular bit line BLP via contact 124 and source select gate 122 connects the string to a common source line SL via contact 126. Between each of the floating gate stacks are source/drain regions 130. FIG. 5 depicts a NAND string being inhibited from programming. The NAND string includes eight memory cells 152, 154, 156, 158, 160, 162, 164, 166 connected in series between drain select gate 170 and source select gate 172. Drain select gate 170 connects the string to a different bit line BLI via contact 174 and source select gate 172 connects the string to the common source line SL via contact 176. Between each of the floating gate stacks are source/drain regions 180.

Each memory cell of FIGS. 4 and 5 includes a floating gate (FG) and a control gate (CG). The memory cells can be formed in a p-well, which itself may be formed within an n-well on a p-type substrate e.g., silicon. The p-well may contain a so called channel implantation, usually a p-type implantation that determines or helps to determine the threshold voltage and other characteristics of the memory cells. The source/drain regions 130 and 180 are n+ doped regions formed in the p-well in one embodiment.

The memory cells of both NAND strings are connected to a common set of word lines WL0, WL1, WL2, WL3, WL4, WL5, WL6, and WL7. A selected word line WL4, for example, receives a program voltage $V_{pgm}$. The program voltage typically comprises a series of voltage pulses (e.g., 12V-24V) that increase in magnitude between each pulse. A boosting voltage $V_{pass}$ is applied to each other word line. The source select gates 122, 172 are in an isolation mode and a low voltage is applied to the source line SL. The low voltage can be about 0V or a slightly higher voltage to provide better isolation characteristics at the source select gate. The drain select gates are turned on by application Of $V_{sgd}$ which can be about 1.5-3.5V.

The NAND string in FIG. 4 that is enabled for programming receives 0V at its bit line BLP. With the drain select gate 120 turned on, the 0V is transferred to the channel region of the string. Channel region 140 below the selected memory cell 110 is at or close to 0V, along with the channels of each other cell of the string. Because of the voltage differential between the channel and the floating gate of memory cell 110, electrons tunnel through the gate oxide (also commonly referred to as tunnel oxide) into the floating gate by Fowler-Nordheim tunneling.

The NAND string of FIG. 5 receives the power supply voltage $V_{dd}$ via its corresponding bit line BLI in order to inhibit the programming of memory cell 160, which receives $V_{pgm}$ on WL4. When $V_{dd}$ is applied, the drain select transistor 170 will initially be in a conducting state. Therefore, the channel area under the NAND string will partly be charged to a higher potential (higher than 0V and typically equal or almost equal to $V_{dd}$). This charging is commonly referred to as pre-charging. Typically, a larger voltage $V_{sg}$ (e.g., 4.0V-4.5V) is applied to the drain select transistor during pre-charging. The pre-charging will stop automatically when the channel potential has reached $V_{dd}$ or a lower potential given by $V_{sg}-V_T$, where $V_T$ is equal to the threshold voltage of the drain select gate 170. In general, during pre-charging, $V_{sg}$ is chosen in such a way that $V_{sg}-V_T>V_{dd}$ so that the channel area under the NAND string can be pre-charged to $V_{dd}$. After the channel has reached that potential, the select gate transistor is non-conducting or made non-conducting by lowering $V_{sg}$ to a value of about $V_{sgd}$ (e.g. 1.5V3.5V), depending on the level of $V_{dd}$ and the select gate threshold voltage. Subsequently, the voltages $V_{pass}$ and $V_{pgm}$ are ramped up from 0V to their respective final values (not necessarily at the same time), and because the drain side select gate transistor 170 is in a non-conducting state, the channel potential will start to rise because of capacitive coupling between the word lines and the channel area (typically around 50%). This phenomenon is called self boosting. The channel area under the NAND string of FIG. 5 is boosted, more or less uniformly, to a boosted voltage level. Region 190 depicts the boosted channel region of the NAND string. Because the voltage differential between the floating gate of memory cell 160 and the underlying channel region 192 has been reduced, programming is inhibited. Note that FIG. 5 shows region 190, which includes a channel area at the surface of the substrate and a depletion layer (an area with increased electrical field due to the channel that is boosted to a high voltage) under the boosted channel area. The channel area exists under each of the floating gate/control gate stacks and between the source/drain regions 180. More information about programming NAND flash memory, including self boosting techniques, can be found in U.S. Pat. No. 6,859,397, "Source Side Self Boosting Technique for Non-Volatile Memory," Lutze et al., incorporated herein by reference in its entirety.

Referring to FIG. 3, a NAND string is typically (but not always) programmed in sequence from the source side to the drain side, for example, from memory cell 58 to memory cell 52. When the programming process is ready to program the last (or near the last) memory cell of the NAND string, if all or most of the previously programmed cells on the string being inhibited (e.g. string 42) were programmed, there is negative charge in the floating gates of the previously programmed cells. Because of this negative charge on the floating gates, the boosting potential may not get high enough and there still may be program disturb on the last few word lines. For example, when programming cell 52, if cells 74, 76 and 78 were programmed, then each has a negative charge at its floating gate which will limit the boosting level of the self boosting process and possibly allow program disturb on cell 72.

Another self boosting technique is Local Self Boosting ("LSB") which attempts to isolate the channel of the cell being inhibited. The word lines neighboring the selected word line are typically at 0V and the remaining non-selected word lines are at $V_{pass}$. Yet another boosting method, called EASB, attempts to isolate the channel of previously programmed cells from the channel of the memory cell being inhibited. In the EASB method, the channel area of the selected NAND string is divided into two areas: an area at the source side of the selected word line that can contain a number of programmed (or erased cells) memory cells and an area at the drain side of the selected word line in which the cells are still in the erased state, or at least not yet in the final programmed state. The two areas are separated by a word line that is biased to a low isolation voltage, typically 0V. Because of this separation, the two areas can be boosted to different potentials. In almost all cases, the area at the drain side of the selected word line will be boosted to a higher potential than the area at the source side. Another boosting scheme, known as Revised Erased Area Self Boosting (REASB) is similar to EASB, except that between the word line receiving the isolation voltage and the selected word line is a word line receiving an intermediate voltage (between $V_{pass}$ and the isolation voltage).

While LSB and EASB provide an improvement over self boosting, they also present a problem that depends on whether the adjacent source side memory cell is programmed or erased. If the adjacent source side cell is programmed, then there is a negative charge on its floating gate. With 0V applied to its control gate, there is a highly reverse biased junction under the negatively charged gate which can cause Gate Induced Drain Leakage (GIDL), also referred to as band-to-band tunneling.

GIDL can also occur at the select gates, especially at the source side select gate. GIDL causes the generation of electrons at the source select gate when the channel under the NAND string is inhibited from programming (boosted to a high voltage). Subsequently, the generated electrons are accelerated in the strong lateral electric field towards the floating gate of the memory cell next to the source select gate. Some of the electrons can gain sufficient energy to be injected into the tunnel oxide under the floating gate or in the floating gate itself and thus, modify the threshold voltage of the corresponding memory cell. FIG. 6 shows a portion of the NAND string of FIG. 5, zooming-in on the drain of the source select gate and a portion of the channel for memory cell 152. Due to boosting of the NAND string during a program inhibit operation (for example when other NAND strings are being programmed), a high voltage is present in the channel area of the boosted NAND string. This high voltage is also present at the junction area between source select gate 172, which is typically biased at 0V, and memory cell 152 next to source select gate 172. This bias condition may cause the creation of electron-hole pairs, also known as GIDL. The holes will go to the p-well area 150. The electrons will move to the boosted channel area. In general, there is a lateral electric field present in the junction area between the source select gate and the memory cell next to the source side select gate because part of that junction (drain/source) is depleted due to the large voltage difference between channel area under the memory cells and the channel area under the select gate. The electrons can be accelerated in the electric field and may gain enough energy to be injected in the tunnel oxide of the memory cell next to the source side select gate or may even reach the floating gate of that memory cell. In both cases, the threshold voltage of the corresponding memory cell will change due to the presence of the injected electrons, thereby, risking an error when reading the memory cell next to the source select gate. To reduce the effects of GIDL, the boosting voltage $V_{pass}$ can be lowered to reduce the amount of channel boosting during the inhibit operation. However, this may result in program disturb due to insufficient boosting.

SUMMARY OF THE INVENTION

Unselected groups of non-volatile storage elements are boosted during programming to reduce or eliminate program disturb for targeted, but unselected memory cells connected to a selected word line. Prior to applying a program voltage to the selected word line and boosting the unselected groups, the unselected groups are pre-charged to further reduce or eliminate program disturb by providing a larger boosted potential for the unselected groups. During pre-charging, one or more pre-charge enable signals are provided at different voltages for particular non-volatile storage elements. For instance, higher pre-charge enable voltages can be applied to non-volatile storage elements that have completed programming prior to programming operation at the selected word line. This may include source side non-volatile storage elements in one embodiment. Applying different pre-charge enable voltages can be combined with the application of different boosting voltages when applying the program voltage. In one instance, the pre-charge and boosting voltages are selected so that the channel regions on the source and drain side of a selected word line are boosted to an equal potential.

In one embodiment, the programming process for non-volatile storage includes applying one or more first pre-charge enable signals to a first set of one or more word lines and applying one or more second pre-charge enable signals to a second set of one or more word lines to enable pre-charging of a group of unselected non-volatile storage elements. The first set has not been subjected to programming since last being erased and is on a drain side of the group with respect to a selected word line. The second set has been subjected to programming since last being erased and is on a source side of the group with respect to the selected word line. The one or more first pre-charge enable signals are at different voltages than the one or more second pre-charge enable signals. Programming in this embodiment can further include applying one or more first boosting signals to the first set after applying the one or more first pre-charge enable signals to boost a channel potential of the group and applying one or more second boosting signals to the second set after applying the one or more second pre-charge enable signals to boost the channel potential of the group. The one or more first boosting signals are at different voltages than the one or more second boosting signals. A program signal is applied to the selected word line while boosting the group of unselected non-volatile storage elements.

One embodiment comprises a non-volatile memory system that includes a group of non-volatile storage elements in communication with a bit line and a source line, and a plurality of word lines in communication with the group that includes a first set of word lines on the bit line side with respect to a particular non-volatile storage element of the group and a second set of word lines on the source line side with respect to the particular non-volatile storage element. The system includes managing circuitry in communication with the plurality of word lines. The managing circuitry applies a first pre-charge enable voltage to each word line of the first set that has been subjected to partial programming, applies a second pre-charge enable voltage to each word line of the first set that has not been subjected to partial programming, and applies a third pre-charge enable voltage to each word line of the second set. The third pre-charge enable voltage is higher than the second pre-charge enable voltage and the second pre-charge enable voltage is lower than the first pre-charge enable voltage.

Various embodiments can include non-volatile storage elements and managing circuitry in communication with the storage elements to perform the various described processes. The managing circuitry can include such elements as control circuitry (e.g. including a state machine), row and column decoders, read/write circuits, and/or a controller for example.

BRIEF DESCRIPTION OF THE DRAWINGS

FIGS. 12A-12C are graphs depicting another technique for two-pass programming.

FIG. 13 is a table depicting the order of programming for the technique depicted in FIGS. 12A-12C.

DETAILED DESCRIPTION

Figure 7:
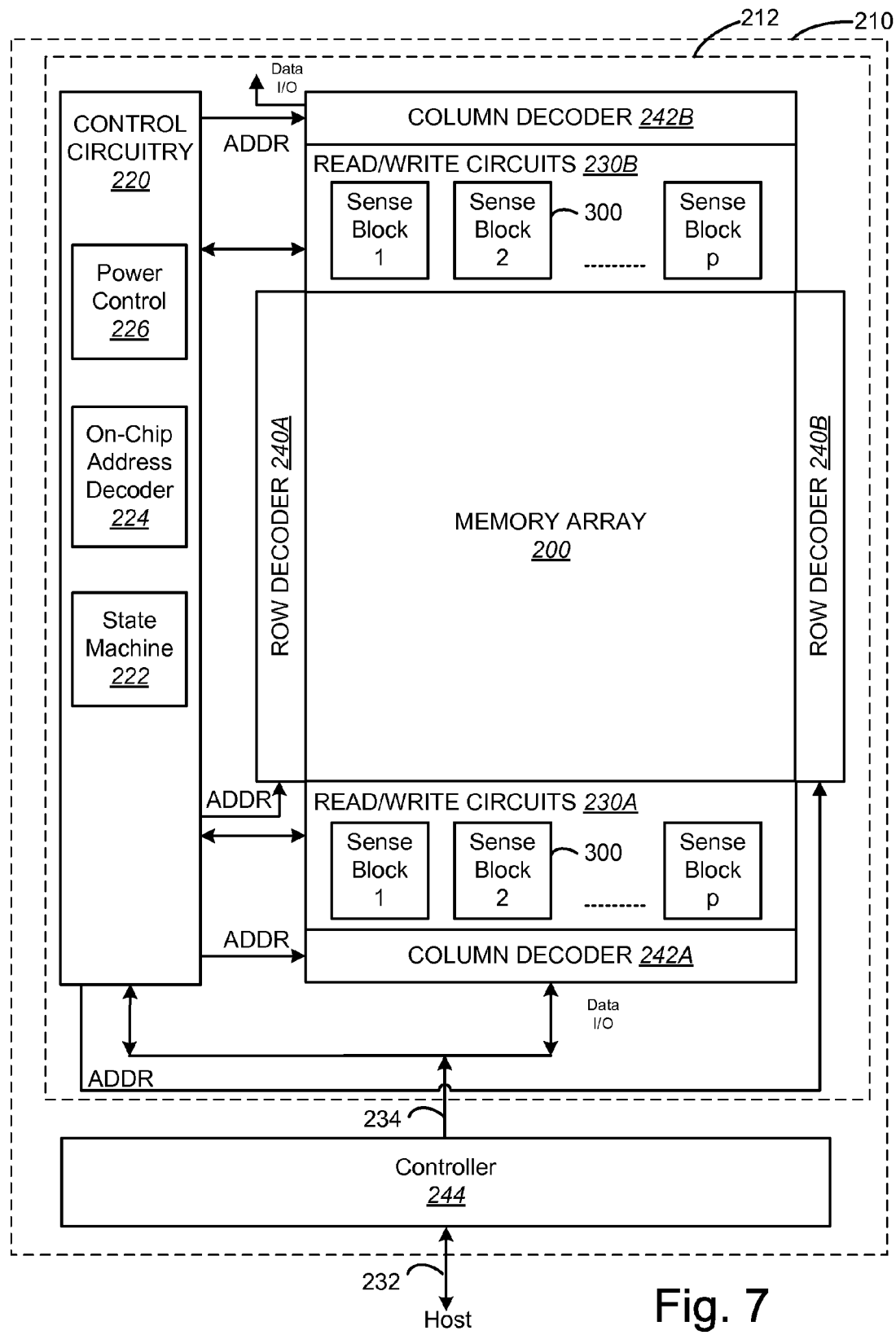
FIG. 7 is a block diagram of a non-volatile memory system that can be used in accordance with one embodiment.

FIG. 7 illustrates a memory device 210 having read/write circuits for reading and programming a page of memory cells in parallel. Memory device 210 may include one or more memory die or chips 212. Memory die 212 includes a two-dimensional array of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment a controller 244 is included in the same memory device 210 (e.g., a removable storage card or package) as the one or more memory die 212. Commands and data are transferred between the host and controller 244 via lines 232 and between the controller and the one or more memory die 212 via lines 234.

The control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations.

Figure 8:
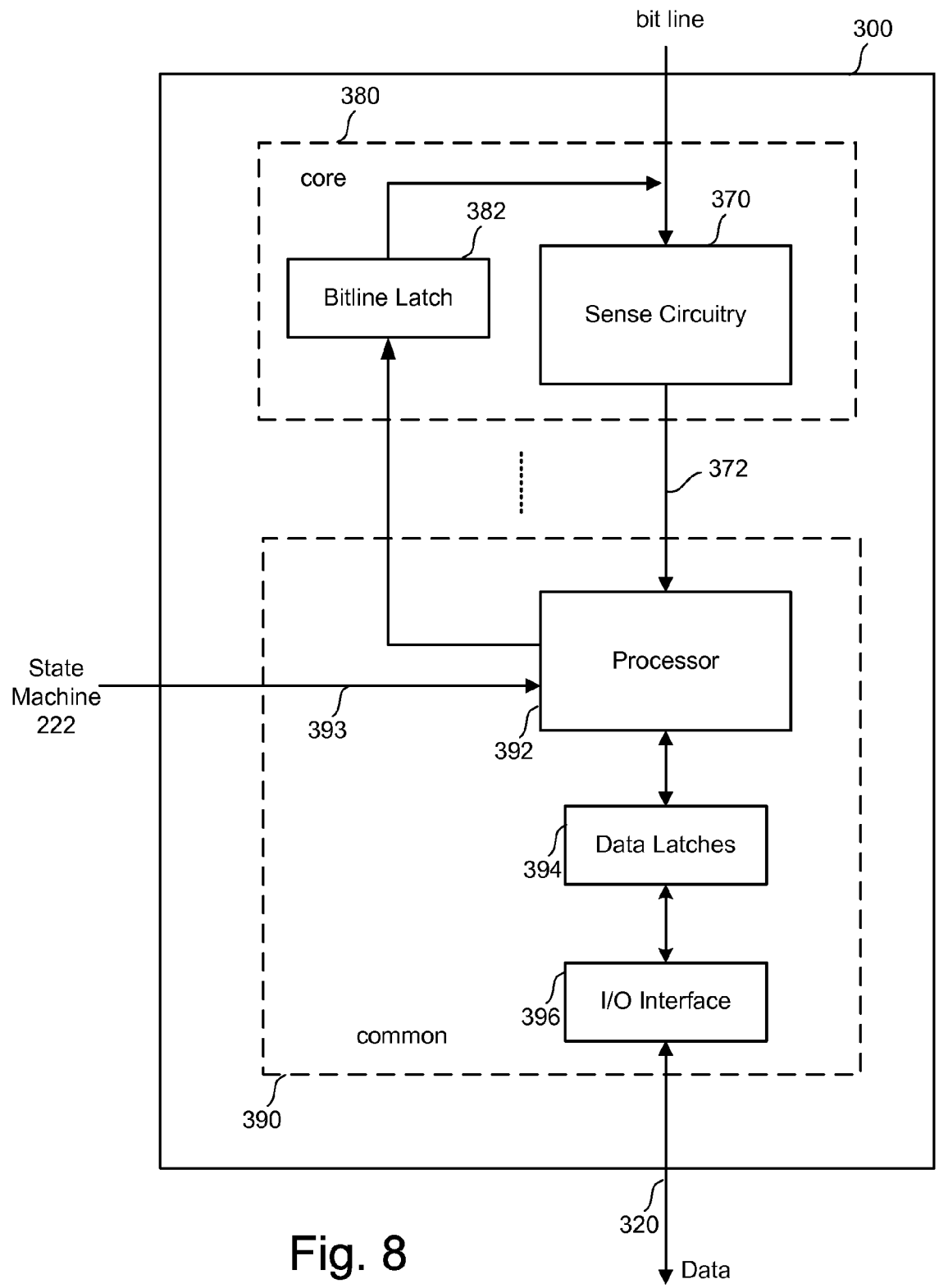
FIG. 8 is a block diagram of a sense block of a non-volatile memory system that can be used in accordance with one embodiment.

FIG. 8 is a block diagram of an individual sense block 300 partitioned into a core portion, referred to as a sense module 380, and a common portion 390. In one embodiment, there will be a separate sense module 380 for each bit line and one common portion 390 for a set of multiple sense modules 380. In one example, a sense block will include one common portion 390 and eight sense modules 380. Each of the sense modules in a group will communicate with the associated common portion via a data bus 372. For further details, refer to U.S. patent application Ser. No. 11/026,536 "Non-Volatile Memory & Method with Shared Processing for an Aggregate of Sense Amplifiers" filed on Dec. 29, 2004, which is incorporated herein by reference in its entirety.

Sense module 380 comprises sense circuitry 370 that determines whether a conduction current in a connected bit line is above or below a predetermined threshold level. Sense module 380 also includes a bit line latch 382 that is used to set a voltage condition on the connected bit line. For example, a predetermined state latched in bit line latch 382 will result in the connected bit line being pulled to a state designating program inhibit (e.g., $V_{dd}$).

Common portion 390 comprises a processor 392, a set of data latches 394 and an I/O Interface 396 coupled between the set of data latches 394 and data bus 320. Processor 392 performs computations. For example, one of its functions is to determine the data stored in the sensed memory cell and store the determined data in the set of data latches. The set of data latches 394 is used to store data bits determined by processor 392 during a read operation. It is also used to store data bits imported from the data bus 320 during a program operation. The imported data bits represent write data meant to be programmed into the memory.

During read or sensing, the operation of the system is under the control of state machine 222 that controls the supply of different control gate voltages to the addressed cell. As it steps through the various predefined control gate voltages corresponding to the various memory states supported by the memory, the sense module 380 may trip at one of these voltages and an output will be provided from sense module 380 to processor 392 via bus 372. At that point, processor 392 determines the resultant memory state by consideration of the tripping event(s) of the sense module and the information about the applied control gate voltage from the state machine via input lines 393. It then computes a binary encoding for the memory state and stores the resultant data bits into data latches 394. In another embodiment of the core portion, bit line latch 382 serves double duty, both as a latch for latching the output of the sense module 380 and also as a bit line latch as described above.

During program or verify, the data to be programmed is stored in the set of data latches 394 from the data bus 320. The program operation, under the control of the state machine, comprises a series of programming voltage pulses applied to the control gates of the addressed memory cells. Each programming pulse is followed by a read back (verify) to determine if the cell has been programmed to the desired memory state. Processor 392 monitors the read back memory state relative to the desired memory state. When the two are in agreement, the processor 392 sets the bit line latch 382 so as to cause the bit line to be pulled to a state designating program inhibit. This inhibits the cell coupled to the bit line from further programming even if programming pulses appear on its control gate. In other embodiments the processor initially loads the bit line latch 382 and the sense circuitry sets it to an inhibit value during the verify process.

In one embodiment, there are three data latches 394 per sense module 380. In some implementations (but not required), the data latches are implemented as a shift register so that the parallel data stored therein is converted to serial data for data bus 320, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Patent Application Pub. No. 2004/0057287, "Non-Volatile Memory And Method With Reduced Source Line Bias Errors," published on Mar. 25, 2004; (2) U.S. Patent Application Pub No. 2004/0109357, "Non-Volatile Memory And Method with Improved Sensing," published on Jun. 10, 2004; (3) U.S. patent application Ser. No. 11/015,199 titled "Improved Memory Sensing Circuit And Method For Low Voltage Operation," Inventor Raul-Adrian Cemea, filed on Dec. 16, 2004; (4) U.S. patent application Ser. No. 11/099,133, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

As is common for flash EEPROM systems, the block is the unit of erase and may be referred to as an erase block or physical block. Each block can contain the minimum number of memory cells that are erased together, although multiple blocks may be erased simultaneously. Smaller units of cells may be erased together in some implementations. In one embodiment, a block includes each NAND string sharing a common set of word lines.

An exemplary structure of memory cell array in one embodiment includes a NAND flash EEPROM partitioned into 1,024 blocks. Each block of memory cells includes a set of bit lines forming columns and a set of word lines forming rows. Each block is divided into a number of pages. A page is typically a minimum unit of programming or reading, although more than one page may be programmed or read in a single operation. In another embodiment, the individual pages may be divided into segments and the segments may contain the fewest number of cells that are written at one time as a basic programming operation. One or more pages of data are typically stored in one row of memory cells. A page can store one or more sectors of data, the size of which is generally defined by a host system. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than those of the user data to which they pertain. A sector of user data is typically 512 bytes, corresponding to the size of a sector commonly used in magnetic disk drives. Overhead data is typically an additional 16-20 bytes. A large number of pages form a block, anywhere from 8 pages, for example, up to 32, 64 or more pages. In some embodiments, a row of NAND strings comprises a block.

The data stored in each block can be simultaneously erased. In one example, there are 8,512 columns that are divided into even columns and odd columns. The bit lines are divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. Therefore, 532 bytes of data can be read or programmed simultaneously in this embodiment. These 532 bytes of data that are simultaneously read or programmed form a logical page. In this example, one block can store at least eight pages. When each memory cell stores two bits of data (e.g. a multi-level cell), one block stores 16 pages. Other sized blocks and pages can also be used.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 9:
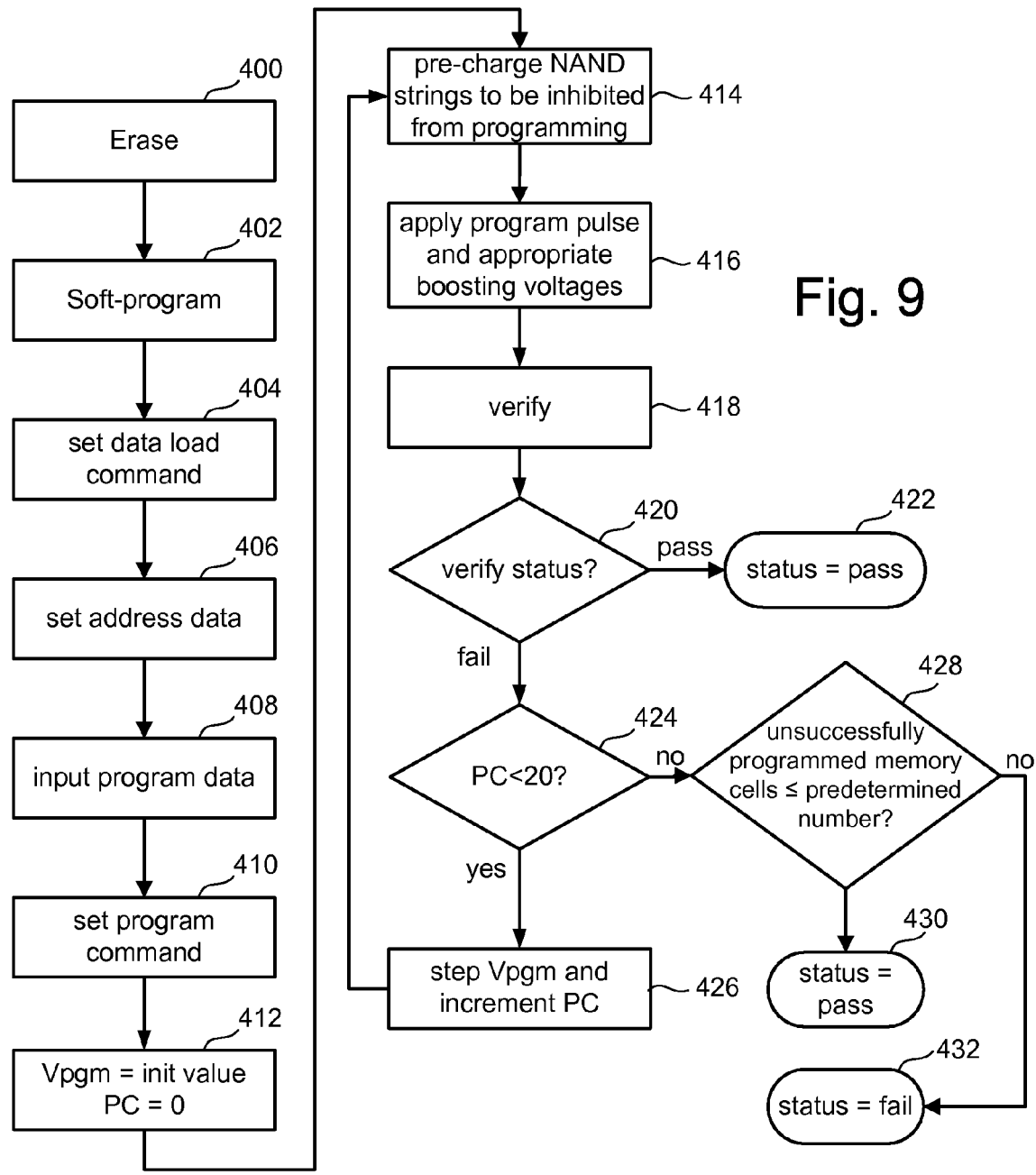
FIG. 9 is a flowchart depicting a method of programming non-volatile memory in accordance with one embodiment.

FIG. 9 is a flow chart describing one embodiment of a method for programming non-volatile memory. The memory cells to be programmed are erased at step 400. Step 400 can include erasing more memory cells than those to be programmed (e.g., in blocks or other units). At step 402, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erase verify level. At step 404, a "data load" command is issued by controller 244 and input to control circuitry 220, allowing data to be input to a data input/output buffer. The input data is recognized as a command and latched by state machine 222 via a command latch signal, not illustrated, input to control circuitry 220. At step 406, address data designating the page address is input to row controllers or decoders 240A and 240B from the controller or host. The input data is recognized as the page address and latched via state machine 222, affected by the address latch signal input to the control circuitry. At step 408, a page of program data for the addressed page is input to a data input/output buffer for programming. For example, 532 bytes of data could be input in one embodiment. That data is latched in the appropriate registers for the selected bit lines. In some embodiments, the data is also latched in a second register for the selected bit lines to be used for verify operations. At step 410, a "program" command is issued by the controller and input to the data input/output buffer. The command is latched by state machine 222 via the command latch signal input to the control circuitry.

Triggered by the "program" command, the data latched in step 408 will be programmed into the selected memory cells controlled by state machine 222. At step 412, $V_{pgm}$, the programming pulse voltage level applied to the selected word line, is initialized to the starting pulse (e.g., 12V) and a program counter PC maintained by state machine 222 is initialized at 0. At step 414, those NAND strings to be inhibited from programming during the next program pulse are precharged. The channel region potential can be raised to aid in reducing program disturb on unselected but targeted cells. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{dd}$ to inhibit programming. One or more boosting voltages are applied at step 416 while applying the program voltage pulse. The first $V_{pgm}$ pulse is applied to the selected word line during a first iteration of the method.

At step 418, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 420, it is checked whether all of the data latches are storing logic "1." If so, the programming process is complete and successful because all selected memory cells were programmed and verified to their target states. A status of "PASS" is reported at step 422. In some embodiments, a pass is reported when a number of latches less than all of the latches are string logic "1."

If, at step 420, it is determined that not all (or a predetermined number) of the data latches are storing logic "1," then the programming process continues. At step 424, the program counter PC is checked against a program limit value. One example of a program limit value is 20, however, other values can be used. If the program counter PC is not less than 20, then it is determined at step 428 whether the number of cells that have not been successfully programmed is equal to or less than a predetermined number. If the number of unsuccessfully programmed bits is equal to or less than the predetermined number, then the programming process is flagged as passed and a status of pass is reported at step 430. The bits that are not successfully programmed can be corrected using error correction during the read process. If however, the number of unsuccessfully programmed bits is greater than the predetermined number, the program process is flagged as failed and a status of fail is reported at step 432. If the program counter PC is less than 20, then the $V_{pgm}$ level is increased by the step size and the program counter PC is incremented at step 426. After step 426, the process loops back to step 414 to apply the next $V_{pgm}$ pulse.

The flowchart of FIG. 9 depicts a single-pass programming method as can be applied for binary storage and full sequence multi-level storage. In a two-pass programming method as can be applied for multi-level storage, for example, multiple programming or verification steps may be used in a single iteration of the flowchart. Steps 412-426 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

Figure 10:
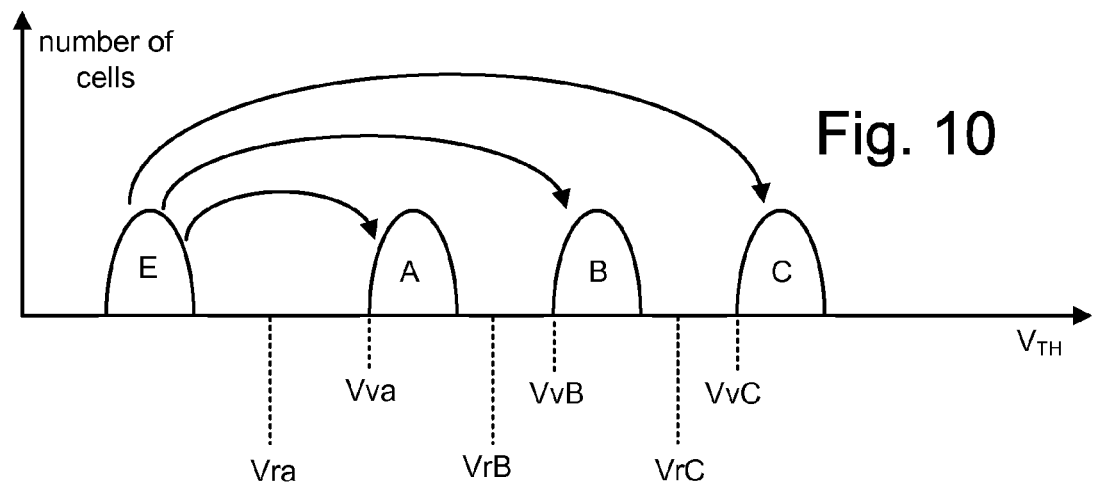
FIG. 10 is a graph depicting an exemplary distribution of threshold voltages for an array of memory cells and a technique for full-sequence programming.

At the end of a successful programming operation, the threshold voltages of the memory cells should be within a one or more distributions of threshold voltages corresponding to a programmed state or erased state, as appropriate. FIG. 10 illustrates threshold voltage distributions for an array of memory cells when each memory cell stores two bits of data. A first threshold voltage distribution E is shown for erased memory cells and three threshold voltage distributions, A, B and C shown for programmed memory cells. In one embodiment, the threshold voltages in the E distribution are negative and the threshold voltages in the A, B and C distributions are positive. Each distinct threshold voltage range of FIG. 10 corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a gray code assignment so that if the threshold voltage of a floating gate erroneously shifts to its neighboring physical state, only one bit will be affected. However, in other embodiments, gray coding is not used. One example assigns "11" to threshold voltage range E (state E), "10" to threshold voltage range A (state A), "00" to threshold voltage range B (state B) and "01" to threshold voltage range C (state C). Although FIG. 10 shows four states, embodiments in accordance with the present disclosure can also be used with other binary or multi-state structures including those that include more or less than four states.

FIG. 10 also depicts a full sequence programming technique. In full sequence programming, memory cells are programmed from the erased state E directly to any of the programmed states A, B or C. A population of memory cells to be programmed may first be erased so that all the memory cells are in erased state E. A series of program voltage pulses is then applied to the control gates of the selected memory cells to program the memory cells directly into states A, B or C. While some memory cells are being programmed from state E to state A, other memory cells are being programmed from state E to state B and/or from state E to state C.

Figure 11:
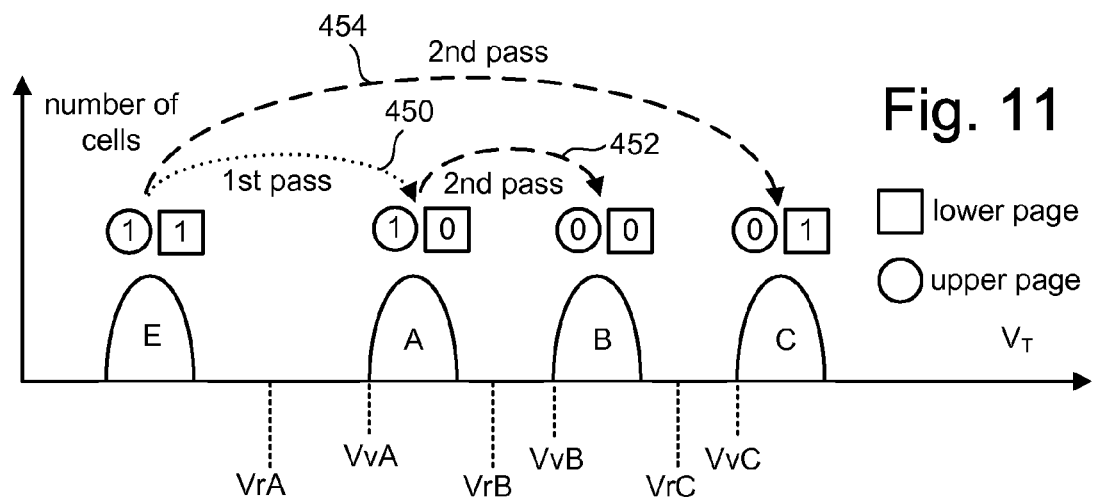
FIG. 11 is a graph depicting an exemplary distribution of threshold voltages for an array of memory cells and a technique for two-pass programming when each memory cell stores data for two pages.

FIG. 11 illustrates an example of a two-pass technique of programming multi-state memory cells that store data for two different pages: a lower page and an upper page. Four states are depicted. For state E, both pages store a "1." For state A, the lower page stores a "0" and the upper page stores a "1". For state B, both pages store "0". For state C, the lower page stores 1 and the upper page stores "0". Although specific bit patterns have been assigned to each of the states, different bit patterns may be assigned.

In a first programming pass, the cell's threshold voltage level is set according to the bit to be programmed into the lower logical page. If that bit is a logic "1", the threshold voltage is not changed since it is in the appropriate state as a result of having been earlier erased. However, if the bit to be programmed is a logic "0", the threshold level of the cell is increased to be state A, as shown by arrow 450. That concludes the first programming pass.

In a second programming pass, the cell's threshold voltage level is set according to the bit being programmed into the upper logical page. If the upper logical page bit is to store a logic 1, then no programming occurs since the cell is in one of the states E or A, depending upon the programming of the lower page bit, both of which carry an upper page bit of 1. If the upper page bit is to be a logic 0, then the threshold voltage is shifted. If the first pass resulted in the cell remaining in the erased state E, then in the second pass the cell is programmed so that the threshold voltage is increased to be within state C, as depicted by arrow 454. If the cell had been programmed into state A as a result of the first programming pass, then the memory cell is further programmed in the second pass so that the threshold voltage is increased to be within state B, as depicted by arrow 452. The result of the second pass is to program the cell into the state designated to store a logic "0" for the upper page without changing the data for the lower page.

FIGS. 12A-12C disclose a process for programming nonvolatile memory that reduces floating gate to floating gate coupling by, for any particular memory cell, writing to that particular memory cell with respect to a particular page subsequent to writing to adjacent memory cells for previous pages. In the example of FIGS. 12A-12C, each cell stores two bits of data per memory cell, using four data states. Erased state E stores data 11, state A stores data 01, state B stores data 10, and state C stores data 00. Other encodings of data to physical data states can also be used. Each memory cell stores a portion of two logical pages of data. For reference purposes, these pages are called upper page and lower page but can be given other labels. State A is encoded to store bit 0 for the upper page and bit 1 for the lower page, state B is encoded to store bit 1 for the upper page and bit 0 for the lower page, and state C is encoded to store bit 0 for both pages. The lower page data for memory cells at a word line WLn are programmed in a first step depicted in FIG. 12A and upper page data for the cells is programmed in a second step depicted in FIG. 12C. If the lower page data is to remain data 1 for a cell, then the cell's threshold voltage remains at state E during the first step. If the lower page data is to be programmed to 0, then the threshold voltage of the memory cell is raised to state B'. State B' is an interim state B having a verify level VvB', which is lower than VvB.

In one embodiment, after the lower page data for the memory cell is programmed, the neighboring memory cells at adjacent word line WLn+1 will be programmed with respect to their lower page. For example, the lower page for memory cells at WL2 in FIG. 3 may be programmed after the lower page for memory cells at WL1. Floating gate coupling may raise the apparent threshold voltage of memory cell 56 if the threshold voltage of memory cell 56 is raised from state E to state B' after programming memory cell 54. The cumulative coupling effect on the memory cells at WLn will widen the apparent threshold voltage distribution of threshold voltages for the cells, as depicted as in FIG. 12B. The apparent widening of the threshold voltage distribution can be remedied when programming the upper page for the word line of interest, as shown in FIG. 12C.

If a memory cell is in erased state E and its upper page bit is to remain at 1, the memory cell remains in state E as shown in FIG. 12C. If the memory cell is in state E and its upper page data bit is to be programmed to 0, the threshold voltage of the memory cell is raised to be within the range for state A. If the memory cell was in intermediate threshold voltage distribution B' and its upper page data is to remain 1, the memory cell is programmed to final state B. If the memory cell is in intermediate threshold voltage distribution B' and its upper page data is to become data 0, the threshold voltage of the memory cell is raised to be within the range for state C. The process depicted by FIGS. 12A-12C reduces the effect of floating gate coupling because only the upper page programming of neighbor memory cells will effect the apparent threshold voltage of a given memory cell. An example of an alternate state coding for this technique is to move from intermediate state B' to state C when the upper page data is a 1, and to move to state B when the upper page data is 0. Although FIGS. 12A-12C provide an example with respect to four data states and two pages of data, the concepts can be applied to other implementations with more or less than four states and different numbers of pages.

FIG. 13 is a table that describes one embodiment of the order for programming memory cells utilizing the programming method of FIGS. 12A-C. For memory cells connected to word line WL0, the lower page forms page 0 and the upper page forms page 2. For memory cells connected to word line WL1, the lower page forms page 1 and the upper page forms page 4. For memory cells connected to word line WL2, the lower page forms page 3 and the upper page forms page 6. For memory cells connected to word line WL3, the lower page forms page 5 and the upper page forms page 7. Memory cells are programmed according to page number, from page 0 to page 7. In other embodiments, other orders of programming can also be used.

In some embodiments, data is programmed to memory cells along a common word line. Thus, prior to applying the program pulses, one of the word lines is selected for programming. This word line can be referred to as a selected word line. The remaining word lines of a block can be referred to as unselected word lines. The selected word line may have one or two neighboring word lines. If the selected word line has two neighboring word lines, the neighboring word line on the drain or bit line side can be referred to as the drain or bit line side neighboring word line and the neighboring word line on the source side can be referred to as the source side neighboring word line. For example, if WL2 is the selected word line, then WL1 is the source side neighboring word line and WL3 is the drain side neighboring word line. In some embodiments, a block of memory cells are programmed from the source to the drain side. For example, memory cells connected to WL0 are programmed first, followed by programming memory cells on WL1, followed by programming memory cells on WL2, etc. FIGS. 12A-12C describe a slight variation on this order that still generally programs from the source side to the drain side.

The margin for program disturb on the selected word line for unselected but targeted memory cells can depend on the state of a neighboring memory cell. Consider the boosting process to inhibit programming in an unselected but targeted memory cell on a selected word line. If a neighboring memory cell is in the erased state, the channel area under that neighboring memory cell should be in a conducting state during the boosting process when $V_{pass}$ is applied thereto. If a neighboring memory cell is not in the erased state, then the channel region of that neighboring cell can become in the cutoff state or conduct less than if the cell were erased. During boosting for this latter case, the channel area under an inhibited memory cell connected to the selected word line may be boosted differently than intended and may not reach a sufficiently boosted level to avoid program disturb.

A similar scenario may occur during a pre-charge phase used during programming. Before boosting and applying the program voltage to a selected word line, a pre-charge enable voltage $V_{pce}$ is applied to the memory cells of the string. A voltage of $V_{sg}$, for example, can be applied to turn on the drain select gate. A pre-charge or program inhibit voltage (e.g., $V_{dd}$) is applied to the inhibited string's bit line. The pre-charge enable voltage is intended to turn on each memory cell so that the bit line voltage will be transferred into the NAND string through the drain select gate to pre-charge the channel region. Electrons are present in the channel region during this pre-charge phase and the channel potential rises to about $V_{sg}-V_T$, where $V_T$ is the threshold voltage of the drain select gate. The pre-charging will stop automatically when the channel potential reaches $V_{sg}-V_T$. The select gate transistor will be turned off when the channel region rises to $V_{sg}-V_T$, or when the drain select gate line SGD is lowered to $V_{sgd}$, for example. $V_{sg}$ is typically chosen so that the channel region will be charged to about $V_{dd}$.

If a memory cell of the NAND string is not conductive during pre-charging, the channel region of the NAND string may not be pre-charged and subsequent program disturb may occur. This is particularly the case on the drain side of the selected word line. If a memory cell between the unselected memory cell being inhibited and the bit line is non-conductive, the bit line voltage may not be impressed into the channel or to sufficient degree for pre-charging. The pre-charging may stop at the memory cell that is in the cutoff state and not properly pre-charge the region surrounding the unselected but targeted memory cell.

Figure 1:
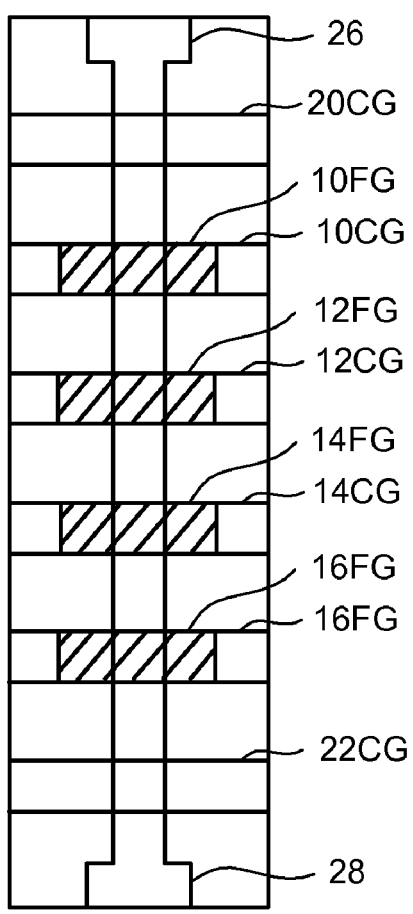
FIG. 1 is a top view of a NAND string.
Figure 2:
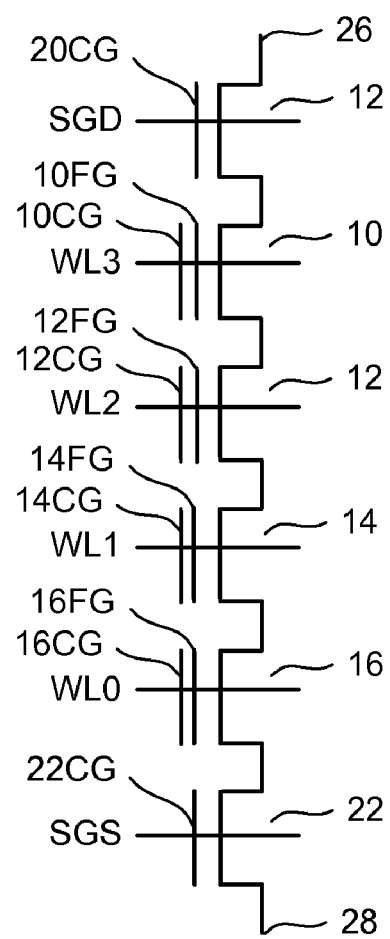
FIG. 2 is an equivalent circuit diagram of the NAND string of FIG. 1.
Figure 3:
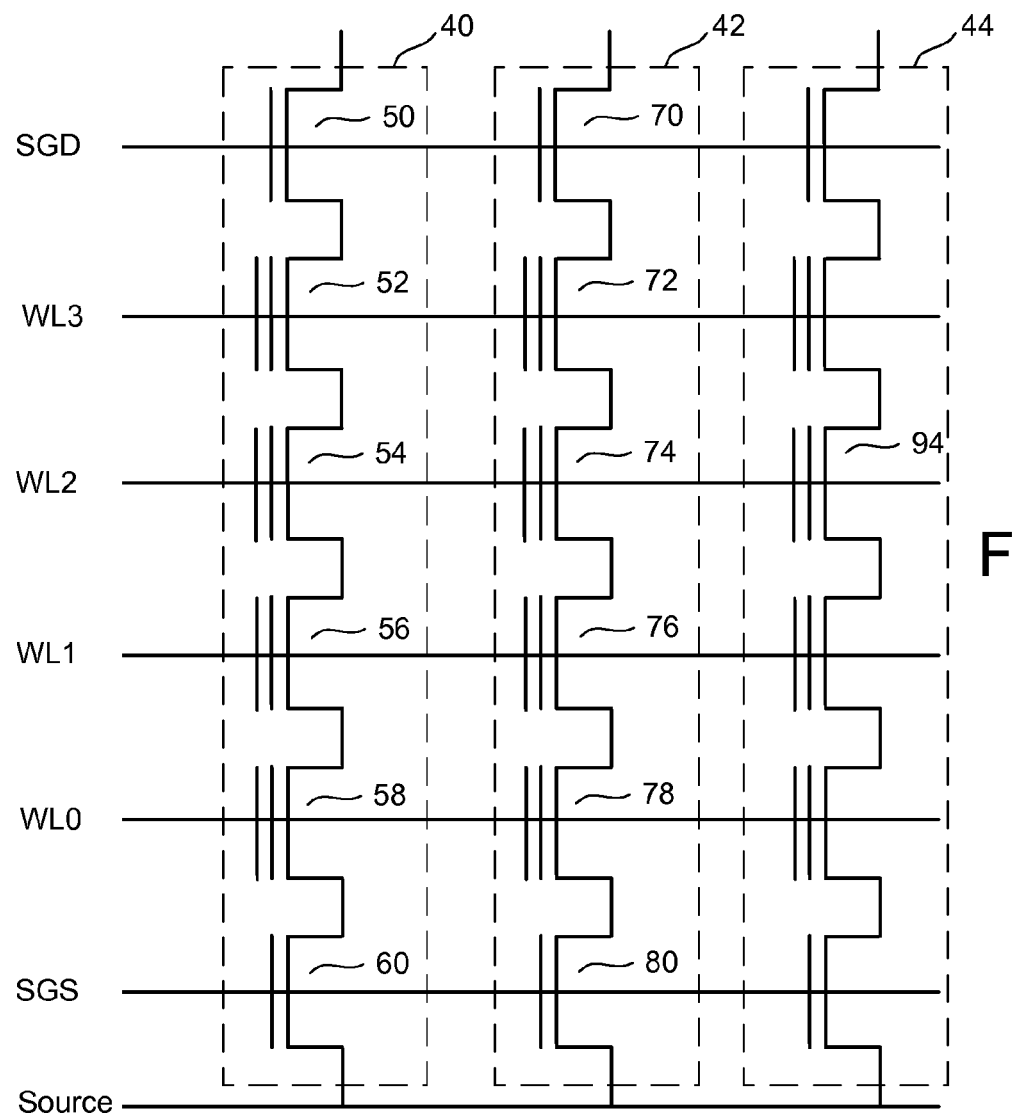
FIG. 3 is a circuit diagram depicting three NAND strings.
Figure 4:
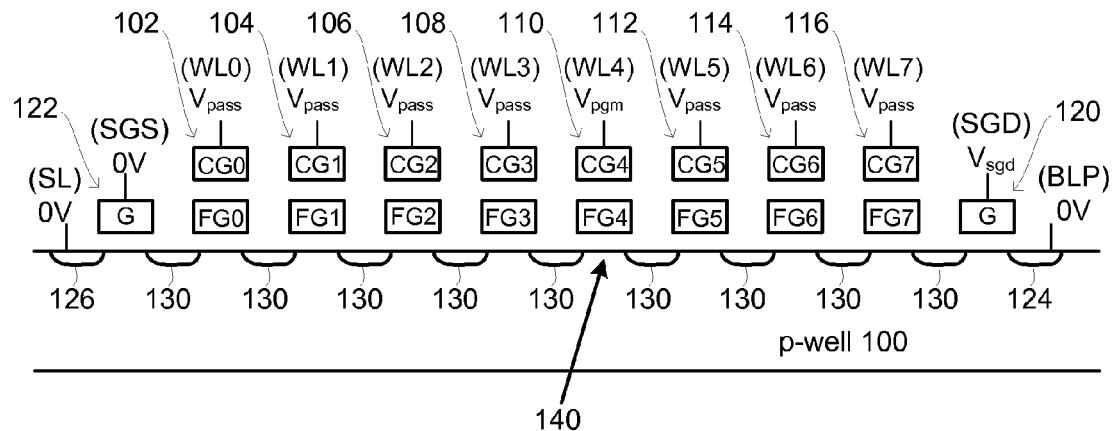
FIG. 4 is a cross-sectional view of a NAND string showing exemplary bias conditions for programming a selected memory cell of the NAND string.
Figure 5:
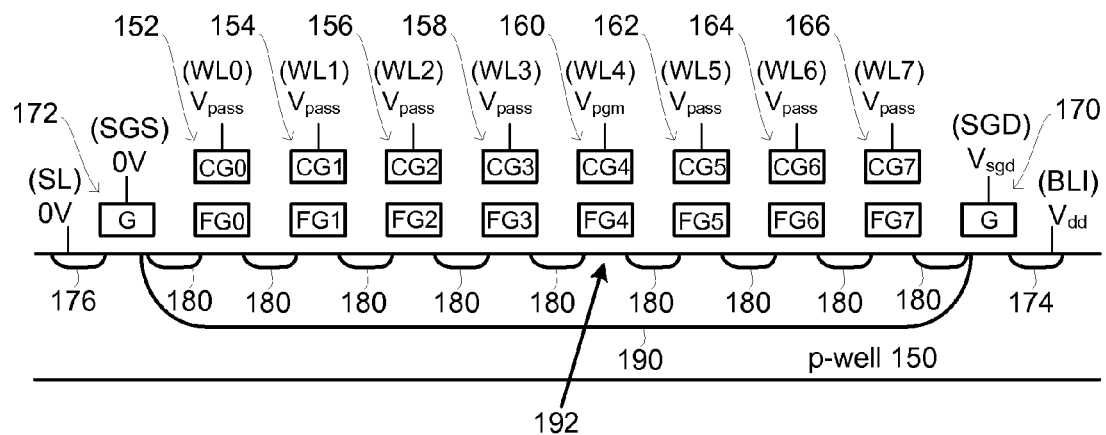
FIG. 5 is a cross-sectional view of a NAND string showing exemplary bias conditions for boosting the NAND string to inhibit programming of a targeted, but unselected memory cell of the NAND string.
Figure 6:
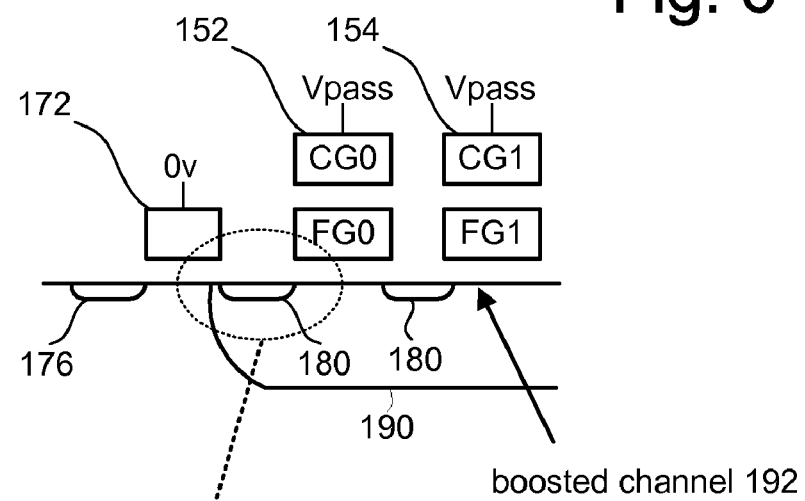
FIG. 6 depicts a portion of the NAND string of FIG. 5 during boosting.
Figure 6:
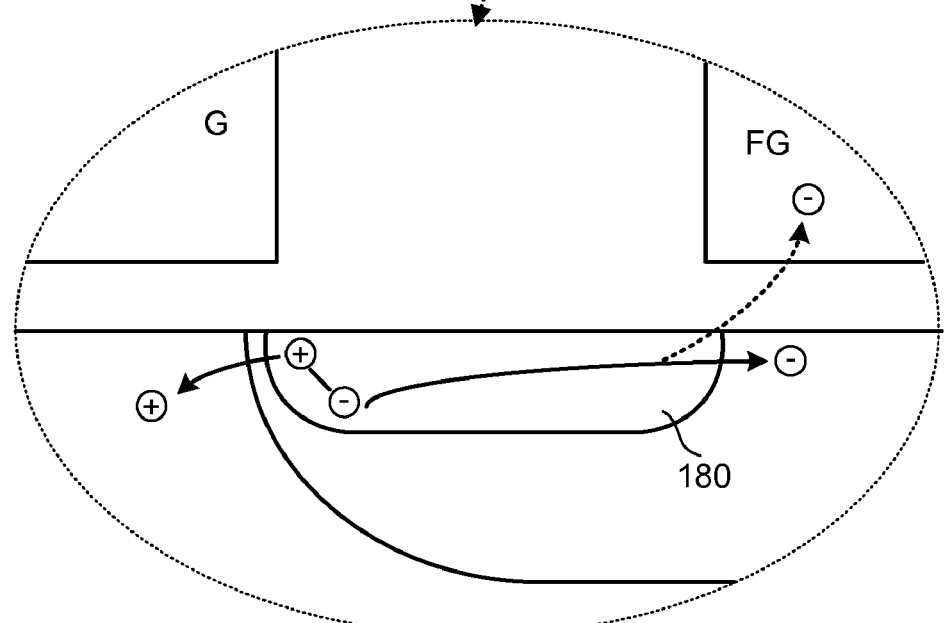

The aforementioned problems associated with cells that are not in the erased state may occur during pre-charging and boosting when such programming techniques as that illustrated in FIGS. 12A-12C are used. Referring to FIG. 3, when programming a selected word line such as WL1 during the second phase of the process depicted in FIGS. 12A-12C, the adjacent word line WL2 on the drain side of the selected word line has already been subjected to partial programming for the first phase. It is possible that a memory cell on the adjacent word line WL2 is partially programmed and in intermediate state B'. Suppose memory cell 74 is in intermediate state B' as a result of partial programming on word line WL2 and memory cell 76 is not to be programmed during the second phase of programming for word line WL1. The pre-charge enable voltage applied to word line WL2 during pre-charging may not turn on memory cell 74. Consequently, the channel region under memory cell 74 will be cut off and the region around memory cell 76 and the rest of the string may not be pre-charged. Likewise, the boosting voltage $V_{pass}$ applied during the boosting phase may not be sufficient to boost the channel and avoid program disturb because of the lack of conduction for this cell.

It is proposed to apply a higher pre-charge enable voltage to certain word lines to remove the pre-charge and boosting dependency on the data of a previously programmed or partially programmed word line. When a selected word line WLn is to be programmed, the unselected word lines can receive different pre-charge enable voltages to ensure that the memory cells of an inhibited NAND string are turned on to enable pre-charging. For example, a neighboring word line WLn+1 on the drain side of the selected word line WLn can receive a higher pre-charge enable voltage when the technique of FIGS. 12A-12C is used. Because this word line has been subjected to partial programming, the higher pre-charge enable voltage can guarantee that the memory cells of WLn+1 are on to enable pre-charging of the inhibited NAND strings. In one embodiment, the higher pre-charge voltage and/or boosting voltage is only used during the second phase when it is possible that cells on WLn+1 are partially programmed. The inventors specifically contemplate that other programming techniques can be used in accordance with one or more embodiments. For example, if two or more word lines are subjected to partial programming or complete programming prior to completing programming of a selected word line, they each can receive the higher pre-charge enable voltage.

Figure 14:
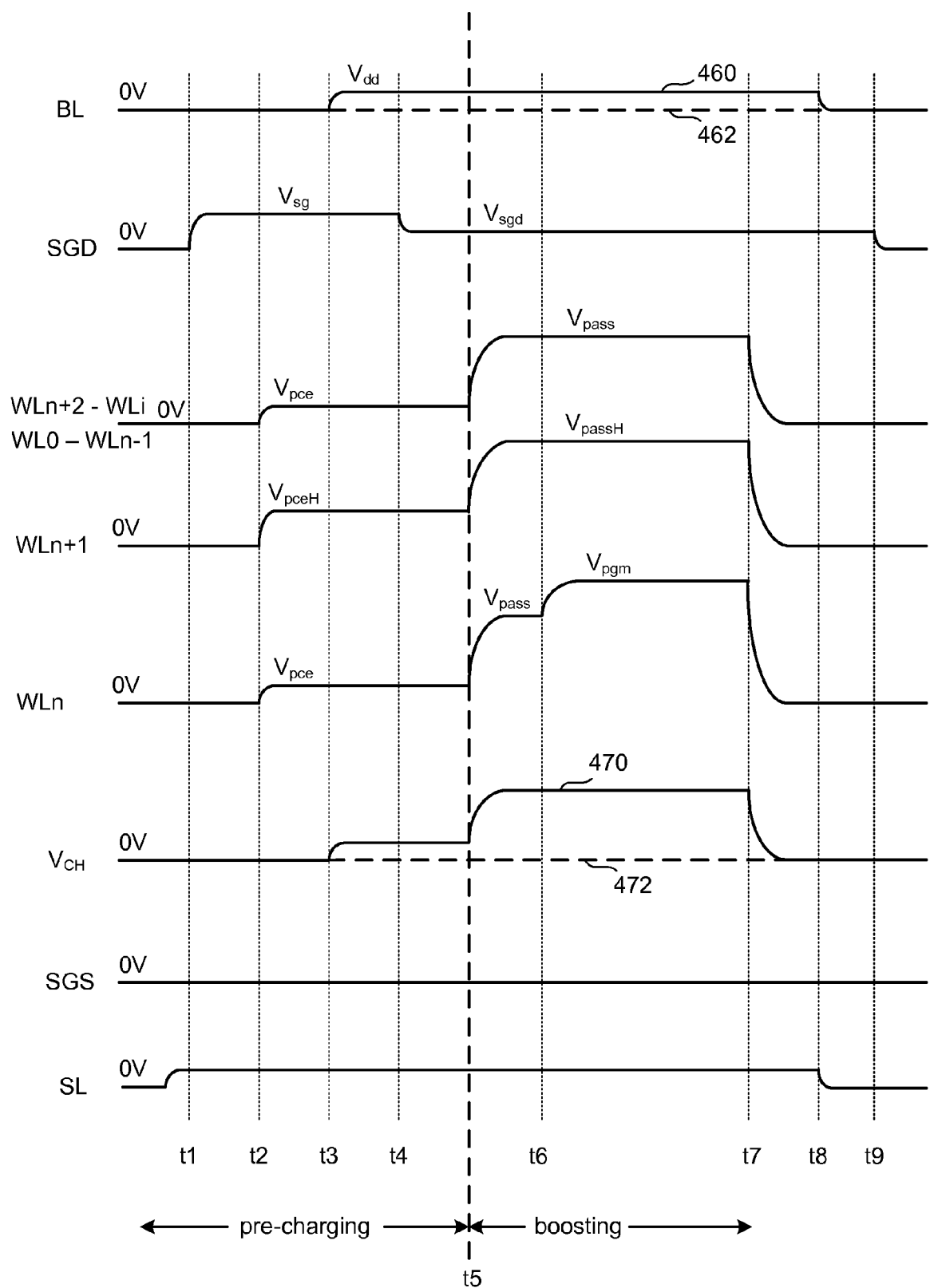
FIG. 14 is a timing diagram for programming non-volatile memory in accordance with one embodiment.

FIG. 14 is a timing diagram depicting various voltage signals that can be applied during a programming process in accordance with one embodiment. In one case, the depicted technique can be used during steps 414 and 416 of FIG. 9. The timing diagram is divided to illustrate the pre-charge phase and boosting phase of the programming process. The voltage signals illustrated for the pre-charge phase from time t1-t5 can be used at step 414 and the voltage signals illustrated for the boosting phase from time t5-t9 can be used at step 416.

The common source line SL is raised to a low voltage of about 1.0V-1.5V at time t1 where it remains for the duration of the programming process. The source line SL is kept at 0V in some embodiments. The source select gate line SGS remains at 0V to place the source select gates into isolation mode. At time $t_1$, the drain select gate line SGD is raised to $V_{sg}$, which is on the order of about 3.5V-4.5V. The pre-charge enable voltages are applied to the word lines at time t2. The selected word line WLn receives the first pre-charge voltage $V_{pce}$. Likewise, each word line neighboring the selected word line on the source side, namely word lines WL0-WLn−1, receive $V_{pce}$ at time t2. Also, those word lines second from the selected word line on the drain side and beyond, namely word lines WLn+2-WLi, receive the first pre-charge voltage $V_{pce}$. In one embodiment, $V_{pce}$ is equal to 0V, however, other voltages can be used as well. Word line WLi is the last word line neighboring the drain side select gates. The word line adjacent the selected word line WLn on the drain side, word line WLn+1, receives a higher pre-charge voltage $V_{pceH}$. Because word line WLn+1 has been subjected to partial programming, a higher pre-charge voltage $V_{pceH}$ is used to ensure that the memory cells connected thereto are turned on. In one embodiment, $V_{pceH}$ is equal to 3V or is made equal to 3V above the level of $V_{pce}$. Different values of $V_{pceH}$ will be appropriate in different implementations. Appropriate values of $V_{pce}$ and $V_{pceH}$ for a particular implementation may be determined by testing individual devices to determine the appropriate levels, characterizing groups of devices, and/or by simulation of the implementation. If a programming scheme is used whereby other word lines such as WLn+2 or WLn+3 are subjected to partial or full programming before word line WLn, a higher pre-charge enable voltage can be used for these word lines as well. Note that some memory cells of a word line will be programmed and others will not when subjected to partial programming, depending on the data to be stored.

At time t3, the data is applied to the bit lines. A first value can be set into a bit line latch for each of the to be inhibited NAND strings and a second value set into the bit line latch for each of the to be programmed NAND strings. Line 462 shows the bit line voltage at 0V for a NAND string having a cell at WLn that is to be programmed. Line 460 shows the bit line voltage at $V_{dd}$ for a NAND string having a cell at WLn that is to be inhibited from programming. $V_{dd}$ designates program inhibit and is often referred to as a program inhibit voltage. It can also be thought of as a pre-charge voltage as this voltage is essentially transferred to the channel region of the inhibited NAND string when a high voltage is applied on SGD. A voltage other than $V_{dd}$ can be used for the pre-charge voltage in other embodiments. A level of the pre-charge voltage, and corresponding level for $V_{sg}$, should be chosen to achieve proper pre-charging within the channel region.

Line 470 depicts the resulting channel voltage of a NAND string that is inhibited from programming. The channel voltage $V_{CH}$ is pre-charged to a level in accordance with the bit line voltage and voltage applied to the drain select gate line. In this case, $V_{sg}$ is applied to SGD such that the full bit line voltage is transferred to the channel region causing a rise in $V_{CH}$ to $V_{dd}$. Line 472 depicts the resulting channel voltage $V_{CH}$ of a NAND string that is enabled for programming. 0V is applied to this string's bit line resulting in a channel voltage of 0V. Thus, there is no pre-charging in the enabled NAND string.

At time t4, the drain select gate line SGD is lowered to $V_{sgd}$. The voltage $V_{sgd}$ is lower than $V_{sg}$ in order to turn off the drain select gate in those NAND strings that are to be inhibited from programming. Thus, the channel region of those NAND strings that are to be inhibited from programming are cutoff from the bit line, enabling boosting of those channel regions as hereinafter described. The NAND strings that are to be programmed, having 0V at their bit line, will remain on when the drain side select gate voltage is lowered to $V_{sgd}$. The channel regions remain at 0V and a path is provided to draw electrons to the floating gates of the memory cells when the programming voltage is applied. In one embodiment, the drain select gate line can be raised to $V_{sgd}$ at time t1. The full bit line voltage $V_{dd}$ may not be transferred into the channel in such an embodiment, leading to a lower pre-charge level.

At time t5, the pre-charge phase ends and the boosting phase begins. The boosting voltages are applied to the various word lines at time t5. Each unselected word line except the drain side neighboring word line receives the boosting voltage $V_{pass}$. The selected word line also receives the boosting voltage $V_{pass}$ at time t5. The drain side neighboring word line receives a higher boosting voltage $V_{passH}$. A higher boosting voltage $V_{passH}$ is applied to ensure proper boosting since the memory cells at WLn+1 may be in the intermediate programmed state shown in FIG. 13B. Such cells may not stay sufficiently turned on under $V_{pass}$ which can lead to insufficient boosting. In one embodiment, $V_{passH}$ is about 1V-4V higher than $V_{pass}$. Other differentials between $V_{pass}$ and $V_{passH}$ can be used in other embodiments. Note that the level of $V_{passH}$ should not be so high as to cause program disturb on WLn+1. For a more complete discussion of the use of a higher pass voltage $V_{passH}$ for word lines such as WLn+1, see U.S. patent application Ser. No. 11/535,628, entitled "Reducing Program Disturb in Non-Volatile Storage," by Hemink et al., filed Sep. 27, 2006 and incorporated by reference herein in its entirety.

The channel voltage $V_{CH}$ of the inhibited NAND string rises in accordance with the boosting voltage applied to the word lines as shown at 470. In some implementations, about a 50% coupling ratio between channel and word line can be expected. If a value of 1V is used for $V_{pce}$ and a value of 10V is used for $V_{pass}$, the word line voltages are increased about 9V. Accordingly, the channel voltage of the inhibited NAND string can be expected to rise about 4.5V. Since the channel region was pre-charged to about $V_{dd}$, the channel voltage $V_{CH}$ can be expected to rise to at least 5.5V. For the NAND string enabled for programming, the channel region remains at 0V as shown at 472 because the drain select gate is on and 0V is applied to the bit line.

At time t6, the program voltage $V_{pgm}$ is applied to the selected word line WLn. Because the inhibited NAND string channel is boosted when the program voltage is applied, the unselected memory cells at WLn for the inhibited NAND strings will not be programmed. The boosted channel region voltage decreases the potential across those memory cells' tunnel oxide regions, thus preventing any inadvertent programming. In one embodiment, the program voltage $V_{pgm}$ and the pass voltages $V_{pass}$ and $V_{passH}$ can be applied to the respective word lines at the same time (e.g., time t5) rather than delaying application of the program voltage. At time t7, the word lines are lowered to 0V. the source and bit lines are then lowered to 0V at time t8. The drain select gate line SGD is lowered to 0V at time t9. Numerous variations to the signals depicted in FIG. 14 can be made in accordance with embodiments, as will be described.

Figure 15:
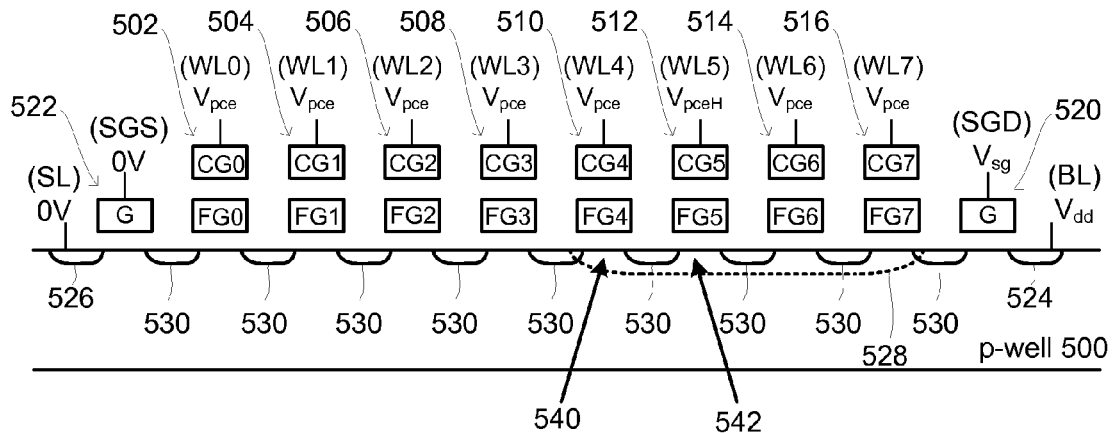
FIG. 15 is a cross-sectional view of a NAND string showing bias conditions for pre-charging the NAND string in accordance with one embodiment.

FIG. 15 is a cross-sectional view of a NAND string that is to be inhibited from programming. FIG. 15 depicts the bias conditions applied to the NAND string during a pre-charge phase in accordance with one embodiment. For example, the NAND string may be inhibited from programming during one iteration of FIG. 9 by a process including application of the bias conditions for pre-charging at step 414. FIG. 15 depicts bias conditions that can be applied between times $t_3$ and $t_4$ in FIG. 14. As a result of the bias conditions of FIG. 15, the memory cell of the word line adjacent to the selected word line in the drain direction should be conductive, even if in an intermediate programmed state, to enable transfer of the bit line voltage into the channel region.

The inhibited NAND string includes eight memory cells 502, 504, 506, 508, 510, 512, 514 and 516. Between each of the memory cells are source/drain regions 530. In some implementations, there is a p-type substrate (e.g., silicon), an n-well within the substrate and a p-well within the n-well (all of which are not depicted to make the drawings more readable). Note that the p-well may contain a so called channel implantation that is usually a p-type implantation that determines or helps to determine the threshold voltage and other characteristics of the memory cells. The source/drain regions 530 are n+ doped regions formed in the p-well in one embodiment.

Source select gate 522 connects the NAND string to the common source line via source line contact 526. Drain select gate 520 connects the NAND string to the particular bit line for that string via bit line contact 524. During programming, the memory cell connected to the selected word line receives the program voltage $V_{pgm}$ at its control gate via the selected word line. In the illustrated example, word line WL4 is the selected word line such that memory cell 510 will receive the program voltage $V_{pgm}$ after the pre-charge phase. Memory cell 510 is not selected for programming. It is to be inhibited from programming and thus is an unselected but targeted memory cell.

A pre-charge enable voltage $V_{pce}$ is applied to each unselected word line except the word line neighboring the selected word line on the drain side. Thus, word lines WL0-WL3 and WL6-WL7 receive the pre-charge enable voltage $V_{pce}$. The selected word line also receives the pre-charge enable voltage $V_{pce}$. Word line WL5 neighbors the selected word line on the drain side. It is possible that this memory cell has been partially programmed as word line WL5 will be subjected to partial programming before completing programming at word line WL4. Accordingly, a higher pre-charge enable voltage $V_{pceH}$ is applied to word line WL5 to ensure that this memory cell turns on during pre-charging. The source line SL is at 1.0V-1.5V. The source select gate line is at 0V to turn off the source select gate 522. The bit line is raised to $V_{dd}$ for the to be inhibited NAND string and $V_{sg}$ is applied to the drain select gate line.

A conduction path is provided through the portion of the NAND string channel at the drain side of the selected word line. The drain select gate line turns on the drain select gate, thus transferring the bit line voltage $V_{dd}$ into that portion of the channel of the NAND string. FIG. 15 graphically depicts a conduction path 528 that is formed through the NAND string under the illustrated bias conditions. As a result, the bit line voltage $V_{dd}$ is impressed in that portion of the channel region of the NAND string. Contrast this with a prior art technique that may apply the same pre-charge enable voltage to every word line of the string. In such a case, the memory cell at word line WL5 may not turn on if it has been partially programmed. Consequently, the conduction path would be broken at channel region 542 such that the portion of the channel of the NAND string below the selected word line will not rise to $V_{dd}$.

FIG. 15 shows path and pre-charged region 528 from the drain select gate through the channel region below selected word line WL4. One or more of the memory cells at the source side of the selected word line may be programmed and thus, may not turn on under application of $V_{pce}$, thus preventing region 528 from including the channels below those memory cells.

It is further possible that memory cell 510 at the selected word line was programmed during previous applications of the program voltage and thus, may keep the conductive path from reaching the channel region below the selected word line. Accordingly, a higher pre-charge enable voltage is applied at the selected word line in various embodiments to guarantee that channel region 540 below the selected word line is pre-charged. The pre-charge enable voltage at the selected word line is $V_{pceH}$ in one embodiment. A different pre-charge enable voltage other than $V_{pceH}$ or $V_{pce}$ is used in one embodiment.

Figure 16:
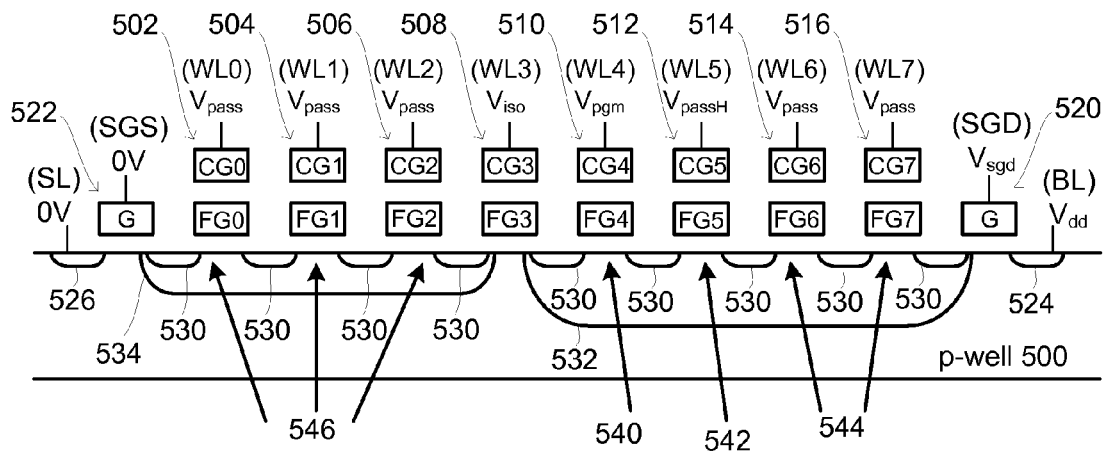
FIG. 16 is a cross-sectional view of a NAND string showing bias conditions for boosting the NAND string in accordance with one embodiment.

FIG. 16 depicts the NAND string of FIG. 15 during an exemplary boosting phase of one embodiment. The boosting phase ensures that the targeted but unselected memory cell at WL4 is inhibited from programming during an iteration of step 416 of FIG. 9. The bias conditions of FIG. 16 can be applied from time t6 to t7 in FIG. 14. As a result of the voltages depicted in FIG. 16, at least a portion (if not all) of the NAND string is boosted so that programming is inhibited. In FIG. 16, an erased area self-boosting technique is illustrated whereby the source side of channel region is isolated from the drain side channel region. This boosting scheme can provide adequate program inhibition even when the source side memory cells may be in a fully programmed state.

A boosting voltage $V_{pass}$ of approximately 8V-9V is applied to the control gates of memory cells 502, 504, 506, 514, and 516 that are not selected for programming. A higher boosting voltage $V_{passH}$ is provided to the control gate of the adjacent memory cell 512 via word line WL5. Adjacent memory cell 512 may be partially programmed or may not, depending on the data to be stored. In one encoding scheme for example, if the data to be stored is a "1," then the memory cell will still be in the erased state E. If the data to be stored is a "0," then the memory cell may have been moved to intermediate state B' (threshold voltage 454 of FIGS. 12A-C). $V_{passH}$ is a higher voltage than $V_{pass}$. In one embodiment, $V_{passH}$ is 1V-4V higher than $V_{pass}$. Other differentials can be employed as appropriate for the particular embodiment. In one implementation, $V_{passH}$ is higher than $V_{pass}$ by an amount equal to the differential between state E and state B' (see FIG. 12B). Note that making $V_{passH}$ too high could cause program disturb on the memory cells receiving $V_{passH}$. For more details regarding a higher pass voltage $V_{passH}$, see U.S. patent application Ser. No. 11/535,628, previously incorporated by reference.

Source select gate 522 is in an isolating state, receiving 0V at its gate. A low voltage, typically in a range of 1.0V-1.5V is applied to the common source line 526. This low voltage can be 0V. However, the source voltage can also be slightly higher than 0V to provide better isolation characteristics of the source side select gate. $V_{sgd}$ is applied to drain side select gate 520. Zero volts is applied to bit line contact 524 via the corresponding bit line to enable programming of selected memory cells at selected NAND strings.

An isolation voltage $V_{iso}$ (e.g., 0V) is applied to memory cell 508 at WL3 to isolate the source side channel region from the drain side channel region. As a result of applying the boosting voltages, a highly boosted channel area and a lower boosted channel area are created. For example, FIG. 16 depicts region 532 that includes the highly boosted channel areas 540, 542, 544 of memory cells 510-516 located at the surface of the substrate and a depletion layer (an area with increased electrical field due to the channel that is boosted to a high voltage) under the higher boosted channel area.

FIG. 16 also shows region 534 that includes the lower boosted channel areas 546 of cells 502-506 located at the surface of the substrate and a depletion layer under the lower boosted channel area. The highly boosted channel area causes memory cell 510 to be properly inhibited from programming. The timing of the signal depicted in FIG. 16 is analogous to that of FIG. 14. FIG. 14 would be modified to lower WLn−1 to $V_{iso}$ at time t5. FIG. 16 only shows one example, and the application of $V_{passH}$ to the neighbor can be used when other word lines are selected for programming. Note that if WL0 is selected for programming, there is no word line on the source side to serve as an isolation region. Accordingly, standard self-boosting can be used, applying $V_{passH}$ and $V_{pass}$, as appropriate, to each unselected word line.

Figure 17:
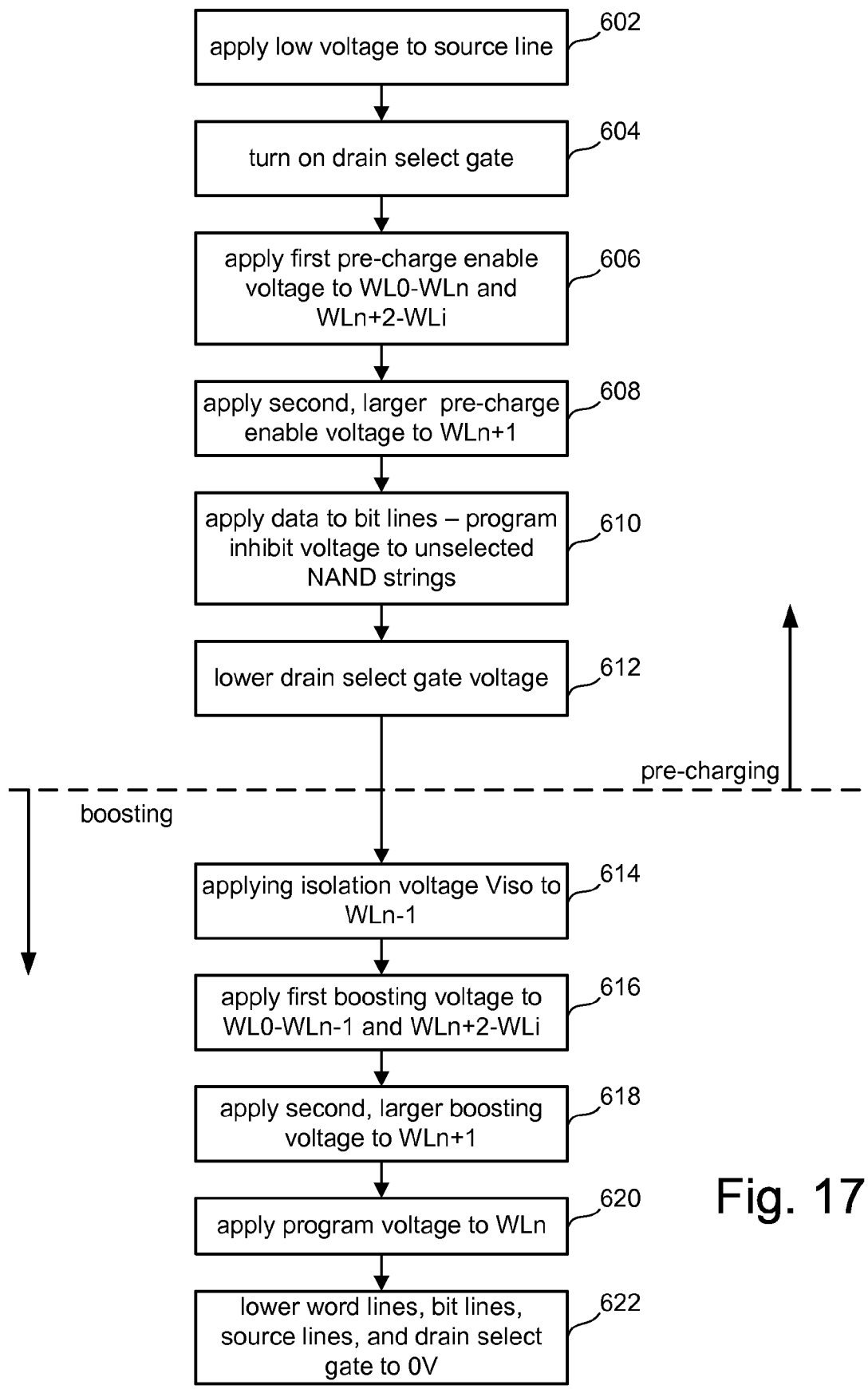
FIG. 17 is a flowchart describing a method of pre-charging and boosting an unselected NAND string in accordance with one embodiment.

FIG. 17 is a flowchart of a method for pre-charging and boosting to inhibit programming in a particular NAND string during programming in accordance with one embodiment. Steps 602 through 612 correspond to the pre-charge phase and steps 614 through 622 correspond to the boosting phase. In one embodiment, steps 602 through 612 are performed for step 414 of FIG. 9 and steps 614 through 622 are performed for step 416 of FIG. 9.

A low voltage on the order of 1.0V-1.5V is applied to the source line at step 602. The drain select gate is turned on at step 604, for example, by applying a positive bias of about $V_{sgd}$. At step 606, a first pre-charge enable voltage $V_{pce}$ is applied to each unselected word line of the NAND string except for the word line WLn+1 neighboring the selected word line WLn on its drain side (bit line side). A second pre-charge enable voltage $V_{pceH}$ is applied to the neighboring word line WLn+1 at step 608. A larger pre-charge enable voltage is used for WLn+1 to guarantee that a conduction path is provided for pre-charging the inhibited NAND string.

At step 610, the data is applied to the bit lines of each NAND string forming part of the programming process. For example, those NAND strings not to be programmed (inhibited) will have $V_{dd}$ applied to their bit lines while those NAND strings to be programmed will have 0V applied to their bit lines. At step 612, the drain select gate line voltage is lowered to turn off the drain select gate for the inhibited NAND strings while leaving the enabled NAND strings in communication with their bit line. Step 612 concludes the pre-charge phase.

The channel region of an inhibited NAND string will be pre-charged in accordance with the bit line voltage to further facilitate program inhibit when the program voltage is later applied.

At step 614, an isolation voltage $V_{iso}$ is applied to the adjacent word line WLn−1 on the source side of the selected word line. At step 616, the first boosting voltage (e.g., $V_{pass}$) is applied to unselected word lines WL0-WLn−2 and WLn+2-WLi. A second boosting voltage (e.g., $V_{passH}$) is applied to the neighboring word line WLn+1 at step 618. The program voltage $V_{pgm}$ is then applied to the selected word line at step 620. With the boosting voltages applied and the inhibited NAND string pre-charged, programming of targeted memory cells on the selected word line is inhibited. At step 622, the word lines, bit lines, source lines, and drain select gate lines are lowered to 0V, marking the completion of one programming iteration. It should be noted that the steps of FIG. 17 will be applied for each application of the programming voltage, for example, before and as part of each program voltage pulse. When programming the word line adjacent to the drain select gate (e.g., WL7), a higher pre-charge and boosting voltage is not used for WLn+1. In this case, there is no drain side neighboring word line WLn+1 that has been subjected to partial programming. FIG. 17 describes an erased area self-boosting technique. Other embodiments may incorporate other boosting techniques, some of which are further described hereinafter. For instance, some embodiments may utilize a standard self-boosting technique without employing an isolation voltage $V_{iso}$.

Other word lines in addition to WLn+1 may benefit from a higher pre-charge enable voltage in some embodiments. For example, a system may partially program more than one memory cell of a NAND string prior to completing the programming of a currently selected memory cell. The programming process of FIGS. 12A-12C can be modified to perform the first pass/step for three word lines before going back to complete programming on the first word line. In one example that stores three pages of data in a memory cell, data can be written in the following order: (1) lower page data is written in WLn, (2) lower page data is written in WLn+1, (3) middle page data is written in WLn, (4) lower page data is written in WLn+2, (5) middle page data is written in WLn+1, and (6) upper page data is written in WLn to finish writing all 3 pages in WLn. Other methods/schemes can also be used. In these examples, there are two word lines that have possibly (depending on the data to be stored) been subjected to partial programming and can receive $V_{pceH}$ and/or $V_{passH}$ during the programming of the first word line.

Figure 18:
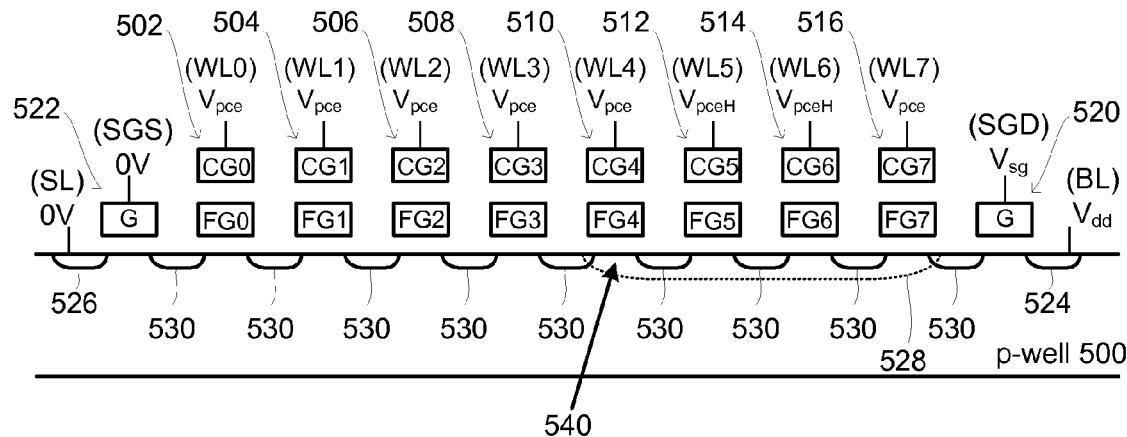
FIG. 18 is a cross-sectional view of a NAND string showing bias conditions for pre-charging the NAND string in accordance with one embodiment.
Figure 19:
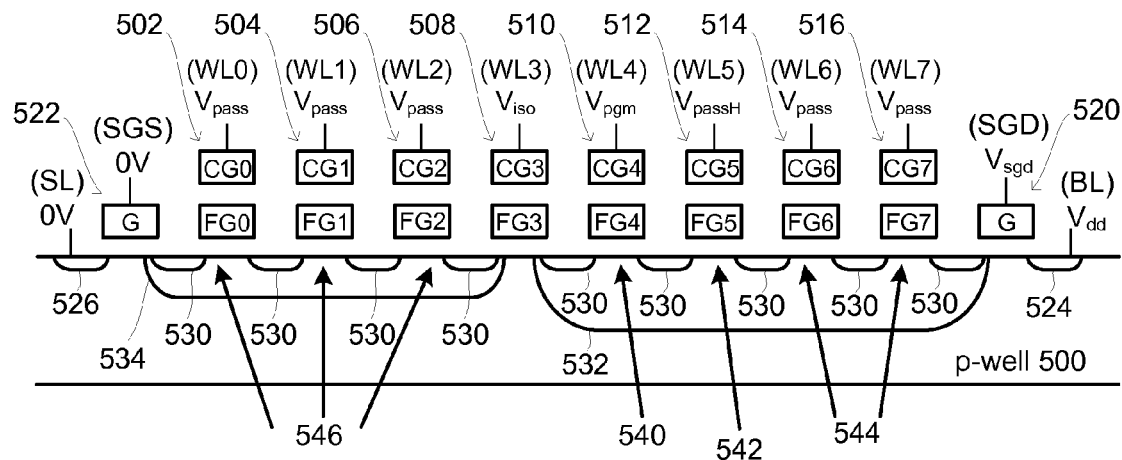
FIG. 19 is a cross-sectional view of a NAND string showing bias conditions for boosting the NAND string in accordance with one embodiment.

FIGS. 18 and 19 depict an embodiment where two word lines receive a higher pre-charge enable voltage $V_{pceH}$. Word line WL4 is again the selected word line for programming. Memory cell 510 connected thereto will receive the program voltage $V_{pgm}$ but is only targeted, and not selected for programming. Word lines WL0-WL4 and WL7 receive the pre-charge enable voltage $V_{pce}$. Word lines WL5 and WL6, however, receive the higher pre-charge enable voltage $V_{pceH}$. Word lines WL5 and WL6 are subjected to at least partial programming before completing programming for word line WL4. Thus, it is possible that memory cells 512 and 514 are partially programmed. The larger pre-charge enable voltage will ensure that these cells provide a conduction path so that the NAND string channel (or at least the drain side portion thereof) can be pre-charged to the bit line voltage $V_{dd}$.

FIG. 19 depicts the NAND string of FIG. 18 during the boosting phase. Again, an erased area self-boosting technique is depicted by way of example. Other schemes can also be incorporated within the pre-charging embodiment depicted in FIG. 18. The first boosting voltage $V_{pass}$ is applied to memory cells 502, 504, 506 and 516 via word lines WL0-WL2 and WL7. The higher boosting voltage $V_{passH}$ is applied to memory cells 512 and 514 via word lines WL5 and WL6. Isolation voltage $V_{iso}$ is applied to word line WL3. Boosted regions 532 and 534 are again created by application of the various boosting voltages. Boosted region 534 provides sufficient boosting of the channel region below memory cell 510 to inhibit programming. In other variations, more than two memory cells can receive the higher pre-charge enable voltage $V_{pceH}$ and/or the higher boosting voltage $V_{passH}$.

Figure 20:
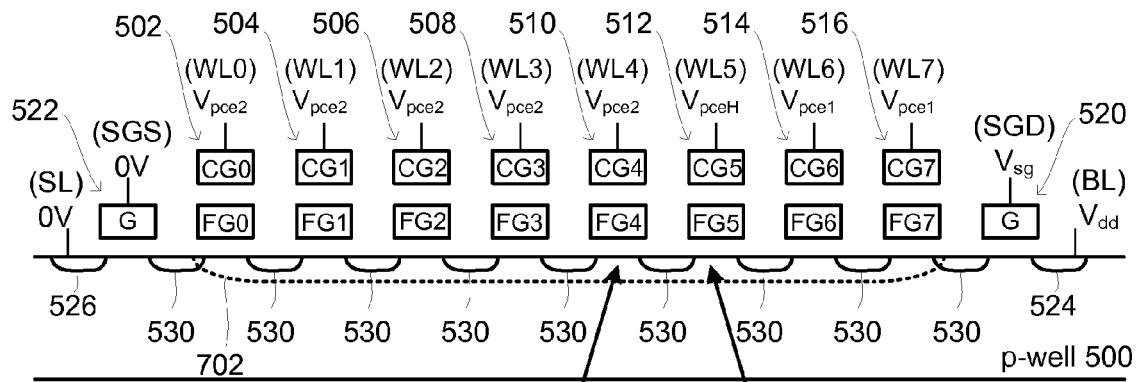
FIG. 20 is a cross-sectional view of a NAND string showing bias conditions for pre-charging the NAND string in accordance with one embodiment.

FIG. 20 depicts a variation of pre-charging where at least three pre-charge enable voltages are used. It was earlier described that one or more source side memory cells may be programmed, thus preventing a full conduction path through the NAND string and limiting the pre-charged region to the drain side of the selected NAND string. In FIG. 20, the drain side neighboring word line receives $V_{pceH}$. The other drain side word lines receive $V_{pce1}$ which can be equal to $V_{pce}$ as earlier described. The source side word lines receive a third pre-charge enable voltage $V_{pce2}$. $V_{pce2}$ can be at a level to ensure that any fully programmed memory cells on the source side turn on during the pre-charge period. While $V_{pceH}$ may vary from $V_{pce1}$ by an amount sufficient to turn on partially programmed cells, $V_{pce2}$ may be increased even further to ensure that fully programmed cells are sufficiently turned on. By applying the three pre-charge enable voltages, the conduction path 528 in FIG. 20 extends from drain select gate 520 to source select gate 522. Accordingly, the entire NAND string can be pre-charged to $V_{dd}$.

In FIG. 20, three pre-charge enable voltages are used to account for partial programming of word line WL5 prior to completing programming at word line WL4. The use of different pre-charge enable voltages at the source and drain side of the selected word line can also be used without a pre-charge voltage $V_{pceH}$ for a partially programmed word line. For instance, during a first programming pass at the selected word line WLn (when WLn+1 has not been subjected to any programming) or in implementations where partial programming is not used, a larger pre-charge enable voltage $V_{pce2}$ can be used at the source side to account for the potentially programmed cells at that side of the NAND string.

Figure 21:
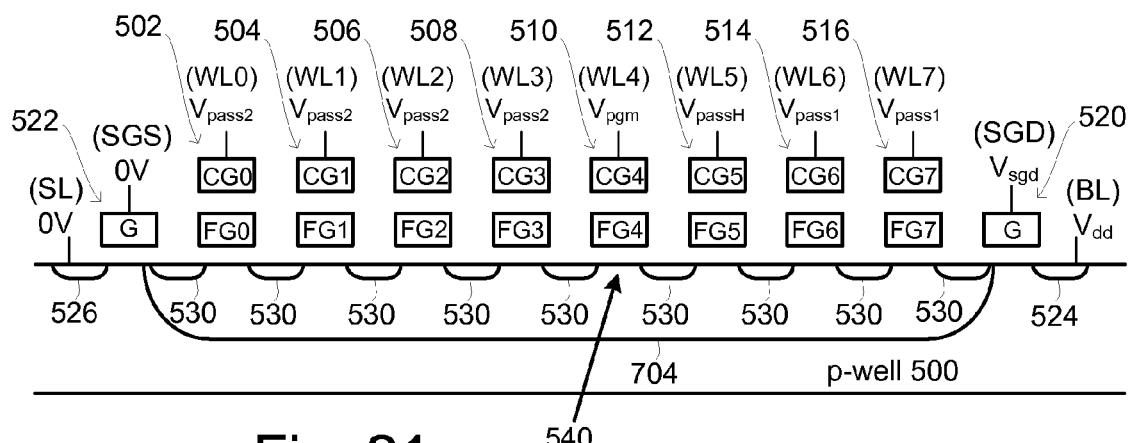
FIG. 21 is a cross-sectional view of a NAND string showing bias conditions for boosting the NAND string in accordance with one embodiment.

FIG. 21 depicts the NAND string of FIG. 20 during a subsequent boosting phase. In FIG. 21, a self-boosting technique is used to boost the entire NAND string channel region sufficiently to prevent program disturb. Selected word line WL4 receives the program voltage $V_{pgm}$. The drain side neighboring word line receives the larger pass voltage VpassH earlier described. Each remaining drain side neighboring word line receives Vpass1. In one embodiment, Vpass1 is equal to Vpass earlier described. A third boosting voltage Vpass2 is applied to the source side neighboring word lines. Vpass2 is at a level to account for a potentially fully programmed state of the memory cells on the source side. By applying the high source side boosting voltage and the intermediate boosting voltage to WLn+1, sufficient boosting of the NAND string is achieved to inhibit programming of the unselected but targeted memory cell. Vpass1 and Vpass2 can also be used without the higher pass voltage VpassH during a first programming pass (when WLn+1 has not been subjected to partial programming) or in embodiments where partial programming is not used.

The level of boosting in the channel region is dependent upon the difference in the pre-charge enable voltage and the boosting voltage applied at the word lines. If $V_{pass2}$−$V_{pce2}$ is equal to $V_{pass1}$−$V_{pce1}$, substantially equal levels of boosting can be achieved on the drain and source sides of the NAND string. Providing an isolation voltage between the source and drain regions as shown in FIG. 16 is typically not needed in such a scenario. The equal boosting levels will provide a substantially continuous conduction path within the NAND string, including through the channel region of the isolating memory cell. It is not necessary, however, that $V_{pass2}-V_{pce2}$ be equal to $V_{pass1}-V_{pce1}$ in all embodiments. For instance, one embodiment may use boosting and pre-charge voltages $V_{pass2}$ and $V_{pce2}$ with an erased area self-boosting technique where $V_{pass2}$ and $V_{pce2}$ are chosen so as not to provide equal boosting at the drain and source sides.

In one variation for example, a large pre-charge enable voltage $V_{pce2}$ can be used as shown in FIG. 20. During the boosting phase, the same boosting voltage $V_{pass}$ can be used on the drain and source side word lines. $V_{pass}-V_{pce2}$ (source side) will not equal $V_{pass}-V_{pce1}$ (drain side). Because of the dependency of boosting on the difference in the boosting voltage and pre-charge enable voltage applied to a word line, the boosted levels on the source and drain side will be different. In such a case, an isolation voltage can be applied to word line WLn−1 to isolate the two regions. In a further variation, different boosting voltages can be used on the drain side and source side word lines. However, the difference in $V_{pass2}-V_{pce2}$ (source side) and $V_{pass1}-V_{pce1}$ (drain side) need not be made equal. Again, an isolation voltage $V_{iso}$ can be applied to the source side adjacent word line WLn−1 to isolate the two boosted regions.

It is further possible to use a value of $V_{pce2}$ on the source side of the selected word line that is less than the value of $V_{pce1}$ used on the drain side. Consider an implementation that uses $V_{pce1}$ equal to 1V. The 1V value will typically not be sufficient to guarantee that the source side memory cells are turned on during pre-charging. Because the final boosted level of the channel region is dependent on the difference in the level of the pre-charge enable voltage and the boosting voltage applied to a word line, a lower value of $V_{pce2}$ can result in a larger final boosted level. For instance, a 0V value for $V_{pce2}$ can give rise to a larger swing when $V_{pass}$ is later applied to the source side word lines to aid in raising the boosted potential of the NAND string.

Figure 22:
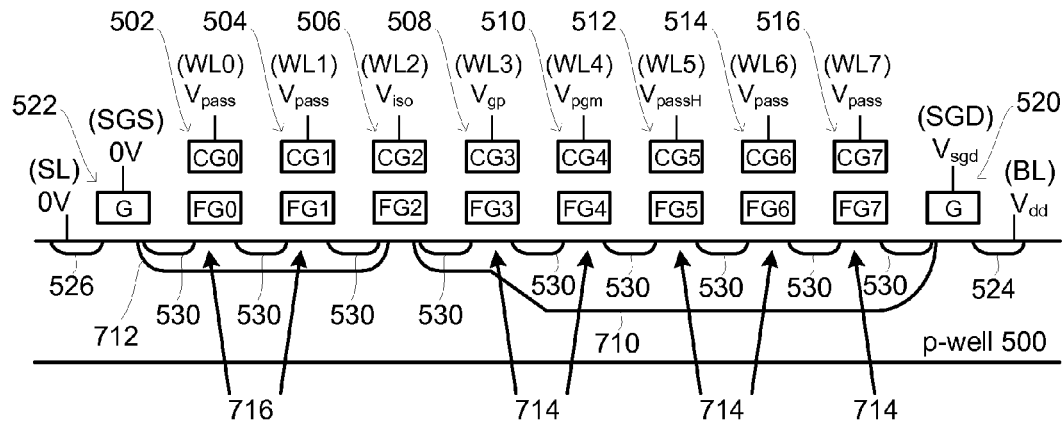
FIG. 22 is a cross-sectional view of a NAND string showing bias conditions for boosting the NAND string in accordance with one embodiment.

FIG. 22 depicts another variation on the boosting phase including a revised erased area self-boosting scheme (REASB). Targeted, but unselected, memory cell 510 receives $V_{pgm}$. Neighbor memory cell 512 receives $V_{passH}$. Memory cells 502, 504, 514, and 516 receive $V_{pass}$. Memory cell 506 receives the isolation voltage (e.g., 0V). Memory cell 508 receives an intermediate voltage $V_{gp}$ (e.g., 2V-5V) via its connected word line. As a result of applying the boosting voltages, a highly boosted channel area and a lower boosted channel area are created. For example, FIG. 22 depicts region 710 that includes the highly boosted channel area 714 located at the surface of the substrate and a depletion layer under the higher boosted channel area. FIG. 22 also shows region 712 that includes the lower boosted channel area 716 located at the surface of the substrate and a depletion layer under the lower boosted channel area. The highly boosted channel area causes memory cell 510 to be properly inhibited from programming. The timing of the signal depicted in FIG. 22 is analogous to that of FIG. 14, with $V_{gp}$ having similar timing to $V_{pass}$. FIG. 22 only shows one example, and the application of $V_{passH}$ to the neighbor can be used when other word lines are selected for programming.

Figure 23:
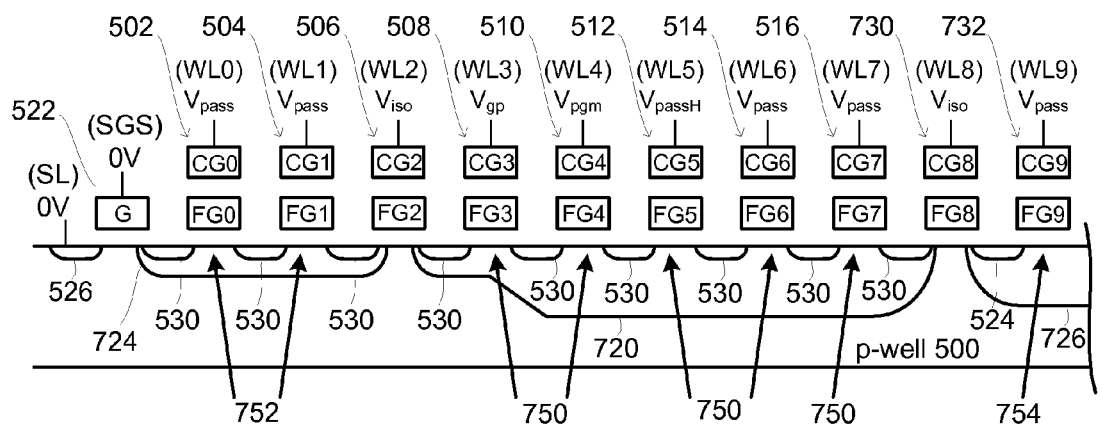
FIG. 23 is a cross-sectional view of a NAND string showing bias conditions for boosting the NAND string in accordance with one embodiment.

FIG. 23 depicts a NAND string when the proposed technology is used to modify another boosting scheme. As discussed above, the technology described herein can be used with NAND strings longer than eight memory cells. FIG. 23 shows a portion of a NAND string having more than eight memory cells. Targeted, but unselected, memory cell 510 receives $V_{pgm}$. Neighbor memory cell 512 receives $V_{passH}$. Memory cells 502, 504, 514, and 516 receive $V_{pass}$. Memory cells 506 and 730 receive the isolation voltage via their connected word lines. Memory cell 508 receives the intermediate voltage $V_{gp}$ via its connected word line. As a result of applying the boosting voltages, a highly boosted channel area, a medium boosted channel area and a lower boosted channel area are created. For example, FIG. 23 depicts region 720 that includes the highly boosted channel area 750 located at the surface of the substrate and a depletion layer under the higher boosted channel area; region 726 that includes the medium boosted channel area 754 located at the surface of the substrate and a depletion layer under the lower boosted channel area; and region 724 that includes the lower boosted channel area 752 located at the surface of the substrate and a depletion layer under the lower boosted channel area. The highly boosted channel area causes memory cell 510 to be properly inhibited from programming. The timing of the signal depicted in FIG. 23 is analogous to that of FIG. 14, with $V_{gp}$ having similar timing to $V_{pass}$. FIG. 23 only shows one example, and the application of $V_{passH}$ to the neighbor can be used when other word lines are selected for programming.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile memory system, comprising:
   a group of non-volatile storage elements;
   a set of word lines in communication with said group of non-volatile storage elements;
   a first subset of word lines on a first side with respect to a particular word line of said set, said first subset has not been subjected to programming when said particular word line is selected for programming;
   a second subset of word lines on a second side with respect to said particular word line, said second subset has been subjected to programming when said particular word line is selected for programming; and
   managing circuitry in communication with said set of word lines, said managing circuitry pre-charges said group prior to applying a program signal to said particular word line by applying one or more first pre-charge enable signals to said first subset and applying one or more second pre-charge enable signals to said second subset that are at different voltages than said one or more first pre-charge enable signals, said managing circuitry boosts a channel potential of said group by applying one or more first boosting signals to said first subset after applying said one or more first pre-charge enable signals and applying one or more second boosting signals to said second subset after applying said one or more second pre-charge enable signals, said one or more first boosting signals are at different voltages than said one or more second boosting signals.

2. The non-volatile memory system of claim 1, wherein said managing circuitry applies a program signal to said particular word line while boosting said group of unselected non-volatile storage elements.

3. The non-volatile memory system of claim 2, wherein:
said program signal is a series of voltage pulses that increase in magnitude.

4. The non-volatile memory system of claim 1, wherein:
a voltage difference between said one or more first boosting signals and said one or more first pre-charge enable signals is substantially equal to a voltage difference between said one or more second boosting signals and said one or more second pre-charge enable signals.

5. The non-volatile memory system of claim 1, wherein:
a voltage difference between said one or more first boosting signals and said one or more first pre-charge enable signals is substantially different than a voltage difference between said one or more second boosting signals and said one or more second pre-charge enable signals.

6. The non-volatile memory system of claim 5, wherein said managing circuitry applies an isolation voltage to a first word line of said set that is adjacent to said particular word line on said second side while applying said first and second boosting signals.

7. The non-volatile memory system of claim 5, wherein said managing circuitry:
applies one or more intermediate voltages to a third subset of one or more word lines that is adjacent to said particular word line on said second side;
applies an isolation voltage to a first word line of said set that is adjacent to said third subset on said second side.

8. The non-volatile memory system of claim 1, wherein said managing circuitry:
applies a third pre-charge enable signal to a first word line of said set that is adjacent to said particular word line on said first side, said first word line has been subjected to partial programming, said third pre-charge enable signal is at a different voltage than said one or more first pre-charge enable signals and said one or more second pre-charge enable signals.

9. The non-volatile memory system of claim 8, wherein said managing circuitry:
applies a fourth pre-charge enable signal to a second word line of said set that is adjacent to said first word line on said first side, said fourth word line has been subjected to partial programming, said fourth pre-charge enable signal is at a same voltage as said third pre-charge enable signal.

10. The non-volatile memory system of claim 1, wherein:
said second subset of one or more word lines includes a first word line that is adjacent to said particular word line and a second word line; and
said managing circuitry applies said one or more second boosting signals by applying a first boosting voltage to said first word line and said second word line.

11. The non-volatile memory system of claim 1, wherein said managing circuitry:
applies a pre-charge voltage to a bit line of said group while applying said first and second pre-charge enable signals and applying said first and second boosting voltages.

12. The non-volatile memory system of claim 1, wherein:
said group of unselected non-volatile storage elements is part of a NAND string having a bit line side and a source line side, said bit line side corresponds to said first side and said source line side corresponds to said second side;
said managing circuitry applies said first and second pre-charge enable signals and said first and second boosting voltages as part of a programming process that applies a program signal in an order that begins with a word line adjacent to a select gate line at said source line side and ends with a word line adjacent to a select gate line at said bit line side.

13. The non-volatile memory system of claim 1, wherein:
said particular word line is connected to an unselected non-volatile storage element of said group that is to be inhibited from programming during application of said program signal;
said selected word line is connected to a selected non-volatile storage element of a different group of non-volatile storage elements that is intended to be programmed.

14. The non-volatile memory system of claim 1, wherein:
said group of unselected non-volatile storage elements is a group of flash memory cells.

15. The non-volatile memory system of claim 14, wherein:
said flash memory cells are multi-state flash memory cells.

16. The non-volatile memory system of claim 1, wherein said managing circuitry includes at least one of row control circuitry, column control circuitry, and a state machine.

17. A non-volatile memory system, comprising:
a group of non-volatile storage elements in communication with a bit line and a source line;
a plurality of word lines in communication with said group including a first set of word lines on said bit line side with respect to a particular non-volatile storage element of said group and a second set of word lines on said source line side with respect to said particular non-volatile storage element;
managing circuitry in communication with said plurality of word lines that applies a first pre-charge enable voltage to each word line of said first set that has been subjected to partial programming, applies a second pre-charge enable voltage to each word line of said first set that has not been subjected to partial programming, and applies a third pre-charge enable voltage to each word line of said second set, said third pre-charge enable voltage is higher than said second pre-charge enable voltage and said second pre-charge enable voltage is lower than said first pre-charge enable voltage.

18. The non-volatile memory system of claim 17, wherein:
said third pre-charge enable voltage is higher than said first pre-charge enable voltage.

19. The non-volatile memory system of claim 17, wherein:
said third pre-charge enable voltage is equal to said first pre-charge enable voltage.

20. The non-volatile memory system of claim 17, wherein said managing circuitry:
applies a first boosting voltage to each word line of said first set that has been subjected to partial programming after applying said first pre-charge enable voltage;
applies a second boosting voltage to each word line of said first set that has not been subjected to programming after applying said second pre-charge enable voltage; and
applies a third boosting voltage to each word line of said second set after applying said third pre-charge enable voltage.

21. The non-volatile memory system of claim 20, wherein:
a difference between said first boosting voltage and said first pre-charge enable voltage is substantially equal to a difference between said second boosting voltage and said second pre-charge enable voltage; and
a difference between said third boosting voltage and said third pre-charge enable voltage is substantially equal to said difference between said first boosting voltage and said first pre-charge enable voltage.

22. A non-volatile memory system, comprising:

a group of non-volatile storage elements in communication with a bit line and a source line;

a plurality of word lines in communication with said group, said plurality of word lines includes a particular word line, a first set of one or more word lines on said bit line side of said group with respect to said particular word line and a second set of two or more word lines on said source line side of said group with respect to said particular word line, said first set has not been subjected to programming and said second set has been subjected to programming when said particular word line is selected for programming;

managing circuitry in communication with said plurality of word lines that pre-charges said group when said storage elements are to be inhibited from programming during application of a program signal to said particular word line, said managing circuitry pre-charges said group by applying a pre-charge voltage to said bit line, applying a first voltage to said first set of one or more word lines while applying said pre-charge voltage, and applying a second voltage to said second set of two or more word lines while applying said pre-charge voltage, said second voltage is lower than said first voltage, said managing circuitry applies a program voltage to said selected word line after applying said first voltage and said second voltage and applies one or more boosting voltages to said first set of word lines and said second set of word lines while applying said program voltage.

23. The non-volatile memory system of claim 22, wherein said managing circuitry applies a third voltage to a third set of word lines on said bit line side of said group while applying said pre-charge voltage, said third set has been subjected to partial programming.

24. The non-volatile memory system of claim 22, wherein said third voltage is lower than said second voltage.

25. The non-volatile memory system of claim 22, wherein:

said group of unselected non-volatile storage elements is a group of flash memory cells.

* * * * *